US012287384B2

(12) United States Patent
Liu et al.

(10) Patent No.: US 12,287,384 B2
(45) Date of Patent: Apr. 29, 2025

(54) RADIO-FREQUENCY POWER OUTPUT DEVICE AND METHOD FOR MAGNETIC RESONANCE SYSTEM

(71) Applicant: GE Precision Healthcare LLC, Waukesha, WI (US)

(72) Inventors: Yu Liu, Beijing (CN); Xin Xie, Beijing (CN); Kai Wang, Beijing (CN); Tingting Song, Beijing (CN); Chunlai Xiao, Beijing (CN); Dongliang Yang, Beijing (CN); Jianye Ning, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 178 days.

(21) Appl. No.: 18/349,806

(22) Filed: Jul. 10, 2023

(65) Prior Publication Data

US 2024/0019511 A1    Jan. 18, 2024

(30) Foreign Application Priority Data

Jul. 12, 2022  (CN) .......................... 202210818085.9

(51) Int. Cl.
| | | |
|---|---|---|
| *G01R 33/34* | (2006.01) | |
| *G01K 1/02* | (2021.01) | |
| *G01K 3/06* | (2006.01) | |
| *H05K 7/20* | (2006.01) | |

(52) U.S. Cl.
CPC ......... *G01R 33/3403* (2013.01); *G01K 1/026* (2013.01); *G01K 3/06* (2013.01); *H05K 7/2089* (2013.01)

(58) Field of Classification Search
CPC ............ G01R 33/3403; G01R 33/3614; G01K 1/026; G01K 3/06; G01K 13/02; G01K 3/04; H05K 7/2089; A61B 5/055
See application file for complete search history.

(56) References Cited

U.S. PATENT DOCUMENTS 6,323,742 B1    11/2001  Ke
2005/0190012 A1   9/2005  Ji

FOREIGN PATENT DOCUMENTS

WO    WO-2017100964 A1 *  6/2017

OTHER PUBLICATIONS

Machine translation of WO-2017100964 (Year: 2017).*

* cited by examiner

*Primary Examiner* — G. M. A Hyder

(57) ABSTRACT

A radio-frequency power output device includes a cooling plate, a temperature detection module, and a control module. The cooling plate is provided with a first circuit board and a second circuit board respectively on two opposite sides thereof, and the first circuit board and the second circuit board are provided with a first radio-frequency power amplification circuit and a second radio-frequency power amplification circuit, respectively. The temperature detection module is used to obtain the temperature of the first circuit board and the temperature of the second circuit board. The control module controls, based on the temperature of the first circuit board, the first radio-frequency power amplification circuit to output a radio-frequency power signal at a target temperature, and controls, based on the temperature of the second circuit board, the second radio-frequency power amplification circuit to output a radio-frequency power signal at the target temperature.

20 Claims, 13 Drawing Sheets

RADIO-FREQUENCY POWER OUTPUT DEVICE AND METHOD FOR MAGNETIC RESONANCE SYSTEM

CROSS REFERENCE

The present application claims priority and benefit of Chinese Patent Application No. 202210818085.9 filed on Jul. 12, 2022, which is incorporated herein by reference in its entirety.

TECHNICAL FIELD

The present invention relates to the field of medical imaging, and relates in particular to a radio-frequency power output device for a magnetic resonance system and a radio-frequency power output method for a magnetic resonance system.

BACKGROUND

Magnetic resonance (MR) technology is one of the major imaging techniques in modern medicine, and has a radio-frequency emission system used to generate high-power radio-frequency excitation signals to excite the nuclei in the body tissue of a subject under examination to produce resonance. The radio-frequency emission system usually employs a radio-frequency amplifier to amplify generated low-power signals into greater radio-frequency power signals to achieve radio-frequency excitation. At present, the rated/peak power of a single radio-frequency amplifier is much less than the power required for radio-frequency excitation. Thus, it is necessary to use signal synthesis techniques to synthesize radio-frequency output powers of a plurality of radio-frequency amplifiers to achieve high-power radio-frequency output.

A major factor affecting synthesis efficiency is the signal balance or consistency between a plurality of radio-frequency amplifiers, and imbalances or inconsistencies between signals can reduce synthesis efficiency. However, the signal characteristics of different radio-frequency amplifiers may vary depending on the environment in which the amplifiers are located, and therefore the amplifiers may have different gains, which in turn affect the synthesis efficiency. A more ideal solution includes arranging all of the radio-frequency amplifiers on the same circuit board, and ensuring the consistency of the environment in which the devices are located by enhancing the craftsmanship of the circuit board, thereby ensuring signal balance. However, said solution requires higher costs and results in system design or layout constraints.

SUMMARY

One aspect of the present invention provides a radio-frequency power output device for a magnetic resonance system, the device comprising: a cooling plate, provided with a first circuit board and a second circuit board respectively on two opposite sides thereof, the first circuit board and second circuit board being provided with a first radio-frequency power amplification circuit and a second radio-frequency power amplification circuit, respectively. A temperature detection module is used to obtain the temperature of the first circuit board and the temperature of the second circuit board; and a control module is used to control, based on the temperature of the first circuit board, the first radio-frequency power amplification circuit to output a radio-frequency power signal at a target temperature, and to control, based on the temperature of the second circuit board, the second radio-frequency power amplification circuit to output a radio-frequency power signal at the target temperature.

Another aspect of the present invention provides a radio-frequency power output device for a magnetic resonance system, the device comprising: a cooling plate having a body plate having opposite first and second sides and a cooling recess provided in the body plate, the cooling recess comprising an opening provided in the first side of the body plate and a bottom portion disposed opposite to the opening and located between the first and second sides. Two radio-frequency power amplification circuits are symmetrically disposed on the first and second sides of the body plate, respectively. A first temperature detector is used to obtain the temperature of the first side of the body plate and a second temperature detector is used to obtain the temperature of the second side of the body plate. A first control circuit and a second control circuit are respectively connected to the two radio-frequency power amplification circuits, each of the first control circuit and the second control circuit being used to control the corresponding radio-frequency power amplification circuit in response to a received signal characteristic adjustment signal, so as to output a radio-frequency power signal at a target temperature. The signal characteristic adjustment signal received by the first control circuit is generated based on the temperature of a first side of the cooling plate, and the signal characteristic adjustment signal received by the second control circuit is generated based on the temperature of a second side of the cooling plate.

Another aspect of the present invention further provides a radio-frequency power output method for a magnetic resonance system, the method comprising: obtaining the actual temperatures of two circuit boards located on two opposite sides of a water-cooling plate respectively, wherein each circuit board comprises a radio-frequency power amplification circuit, and each radio-frequency power amplification circuit comprises a plurality of radio-frequency power amplifiers. The method also includes receiving a radio-frequency power input signal distributed to the radio-frequency power amplification circuit of each circuit board; and controlling, based on the respective actual temperatures of the two circuit boards, the corresponding radio-frequency power amplification circuit to output a radio-frequency power signal at a target temperature.

It should be understood that the brief description above is provided to introduce, in a simplified form, concepts that will be further described in the detailed description. However, the brief description above is not meant to identify key or essential features of the claimed subject matter, and the scope thereof is defined uniquely by the claims that follow the detailed description. Furthermore, the claimed subject matter is not limited to implementations that solve any deficiencies raised above or in any section of the present disclosure.

BRIEF DESCRIPTION OF THE DRAWINGS

The present invention will be better understood by reading the following description of non-limiting embodiments with reference to the accompanying drawings, wherein.

The accompanying drawings illustrate components, systems, and methods described in the MRI method and system. Together with the following description, the accompanying drawings illustrate and explain the structural principles, methods and principles described herein. In the accompanying drawings, the thickness and dimensions of the components may be enlarged or modified in other manners for clarity. Well-known structures, materials, or operations are not shown or described in detail to avoid obscuring the components, systems, and methods described.

DETAILED DESCRIPTION

Specific embodiments of the present invention will be described below. It should be noted that in the specific description of these embodiments, for the sake of brevity and conciseness, this specification may not describe all features of the actual embodiments in detail. It should be understood that in the actual implementation process of any embodiments, just as in the process of any one engineering project or design project, a variety of specific decisions are often made to achieve specific goals of the developer and to meet system-related or business-related constraints, which may also vary from one embodiment to another. Furthermore, it should also be understood that although efforts made in such development processes may be complex and tedious, for those of ordinary skill in the art related to the disclosure of the present invention, some design, manufacture, or production changes based on the technical disclosure of the present disclosure are only common technical means, and should not be construed as insufficient content of the present disclosure.

Unless otherwise defined, the technical or scientific terms used in the claims and the description should be as they are usually understood by those possessing ordinary skill in the technical field to which the present invention pertains. Terms such as "first," "second," and similar terms used in this specification and claims do not denote any order, quantity, or importance, but are only intended to distinguish different constituents. The terms "one" or "a/an" and similar terms do not express a limitation of quantity, but rather that at least one is present. The terms "include" or "comprise" and similar words indicate that an element or article preceding the terms "include" or "comprise" encompasses elements or articles and equivalent elements thereof listed after the terms "include" or "comprise," and does not exclude other elements or articles. The terms "connect" or "link" and similar words are not limited to physical or mechanical connections, and are not limited to direct or indirect connections. Furthermore, it should be understood that references to "an embodiment" or "embodiments" of the present disclosure are not intended to be construed as excluding the existence of additional implementations that also incorporate the referenced features.

Figure 1:
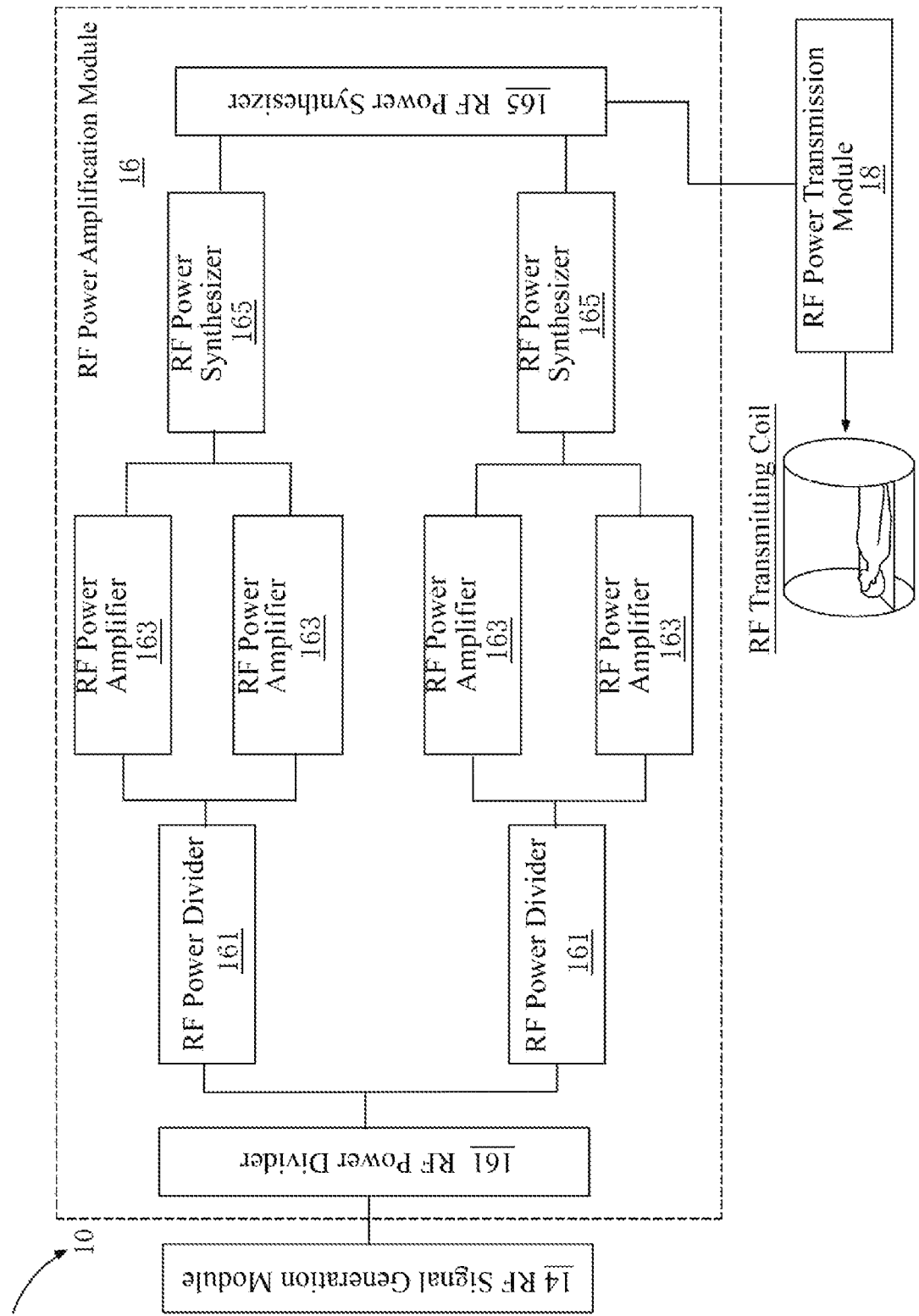
FIG. 1 illustrates a radio-frequency emission system 10 for a magnetic resonance system according to some embodiments.

Referring to FIG. 1, a radio-frequency emission system 10 for a magnetic resonance system according to some embodiments is illustrated. The radio-frequency emission system 10 includes a radio-frequency signal generation module 14, a radio-frequency power amplification module 16, and a radio-frequency power transmission module 18. The radio-frequency signal generation module 14 is used to generate radio-frequency signals based on a predetermined scan sequence. In some embodiments, the radio-frequency signals may be used for radio-frequency excitation. For example, the radio-frequency signals may have a frequency predetermined based on the precession frequency of protons (e.g., hydrogen protons) in the tissue being examined. This radio-frequency signals usually have a low power. In some embodiments, the radio-frequency signal generation module 14 may include one or more of a radio-frequency oscillator, a frequency synthesizer, a digital-to-analog converter, a filter, a modulator, and other components. The radio-frequency power amplification module 16 is used to perform power amplification on the radio-frequency signals generated by the radio-frequency signal generation module 14, so as to output amplified radio-frequency power signals. The amplified radio-frequency power signals are processed by the radio-frequency power transmission module 18 and transmitted to a radio-frequency transmitting coil of the magnetic resonance system to resonate with protons of the tissue positioned in the radio-frequency transmitting coil.

The radio-frequency power amplification module 16 includes a plurality of radio-frequency power dividers 161, a plurality of radio-frequency power amplifiers 163, and a plurality of radio-frequency power synthesizers 165. The one or more radio-frequency power dividers 161 may include a primary divider which is used to connect to the above radio-frequency signal generation module 14 and to split a radio-frequency signal output from the radio-frequency signal generation module 14 into a plurality of first radio-frequency component signals with reduced amplitude. The primary divider having a plurality of output ports, each output port being used to connect in series with a secondary divider and output a first radio-frequency component signal to the secondary divider. Each secondary divider is used to further split the received first radio-frequency component signal into a plurality of second radio-frequency component signals with further reduced amplitude. Each secondary divider has a plurality of output ports, and the output port of each secondary divider is used to connect to an input port of one of the plurality of radio-frequency power amplifiers 163 to output the second radio-frequency component signal to the corresponding radio-frequency power amplifier.

In some embodiments, according to requirements, the secondary dividers may not be provided, i.e., the plurality of output ports of the primary divider may also be connected directly to the plurality of radio-frequency power amplifiers 163 respectively, so as to directly output the first radio-frequency component signal to the corresponding radio-frequency power amplifier 163.

Each radio-frequency power amplifier 163 is used to amplify the received radio-frequency component signal. Ideally, the plurality of radio-frequency power amplifiers 163 have the same amplification gain. However, this amplification gain may vary depending on the environment (e.g., temperature).

The plurality of radio-frequency power synthesizers 165 may include primary synthesizers and secondary synthesizers, and the plurality of radio-frequency power amplifiers 163 may be divided into one or more groups. The output ports of each group of power amplifiers 163 are connected to one primary synthesizer, so that the plurality of radio-frequency component signals output from each group of radio-frequency power amplifiers 163 are synthesized into a first radio-frequency synthesized signal with increased amplitude by the corresponding primary synthesizer. Each secondary synthesizer has a plurality of input ports, and the plurality of input ports of each secondary synthesizer are used to receive first radio-frequency synthesized signals from the output ports of the plurality of primary synthesizers respectively, so as to further synthesize the received first radio-frequency synthesized signals into a second radio-frequency synthesized signal with further increased amplitude, which is processed by the radio-frequency power transmission module 18 and transmitted to the radio-frequency transmitting coil of the magnetic resonance system.

In some embodiments, according to requirements, the primary synthesizers may not be provided, i.e., the radio-frequency signals output from the plurality of radio-frequency power amplifiers 163 may be synthesized via one radio-frequency power synthesizer and then transmitted to the radio-frequency transmitting coil via the radio-frequency power transmission module 18.

In the radio-frequency power amplification module 16, components such as the radio-frequency power amplifier 163, the radio-frequency power synthesizer 165, the radio-frequency power divider 161 and other devices may be a set of Wilkinson devices, so as to achieve a compact size and applicability to a space-constrained system, e.g., applicability to a magnetic resonance system.

The synthesis efficiency of each radio-frequency power synthesizer 165 in the radio-frequency power amplification module 16 is affected by the balance/consistency of signal characteristics between signals at the input ports thereof, and the signal characteristics specifically include the phase and amplitude of the radio-frequency signal.

Figure 2:
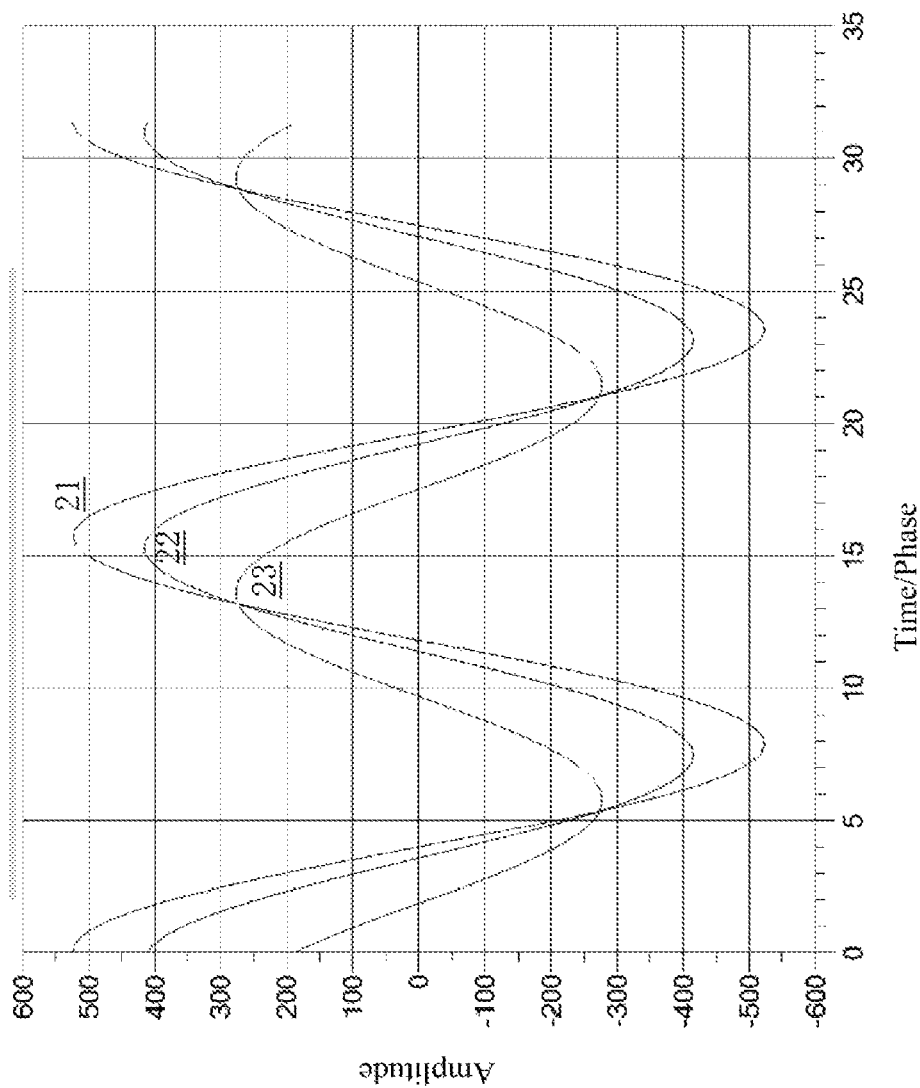
FIG. 2 illustrates example waveforms of a plurality of input signals of a radio-frequency power synthesizer.

For example, FIG. 2 illustrates example waveforms of a plurality of input signals of a radio-frequency power synthesizer, including waveforms 21, 22, and 23, which may be respectively output by, for example, the three radio-frequency power amplifiers 163 shown in FIG. 1 to the corresponding radio-frequency power synthesizer 165. Ideally, the three waveforms should all have the same (overlapping) amplitude and phase, and thus may achieve 100% synthesis efficiency. However, in FIG. 2, the amplitudes and phases of the three waveforms 21, 22 and 23 are different from each other. Such differences result in the input imbalance of the radio-frequency power synthesizer, and the larger the difference, the higher the degree of input imbalance, thereby lowering the final synthesis efficiency.

Figure 3:
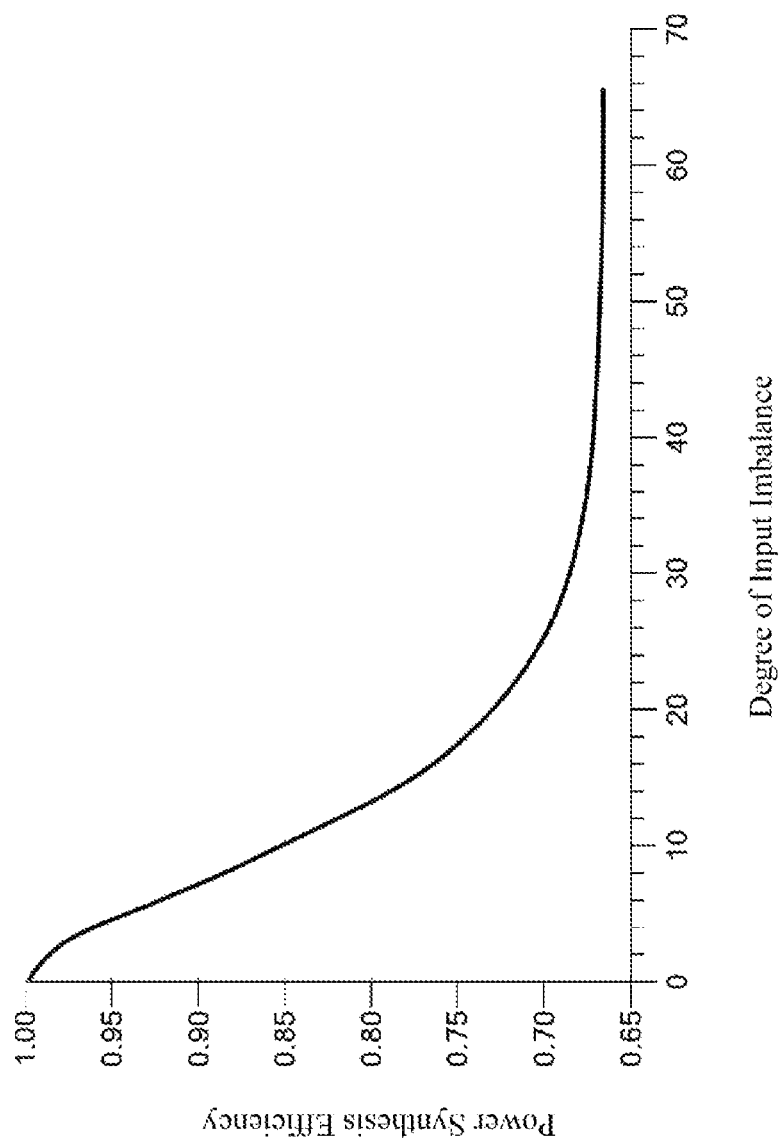
FIG. 3 illustrates the relationship between the synthesis efficiency of a radio-frequency power synthesizer and the degree of input imbalance thereof.

FIG. 3 illustrates the relationship between the synthesis efficiency of a radio-frequency power synthesizer and the degree of input imbalance thereof, wherein the x-coordinate represents the degree of input imbalance and the y-coordinate represents power synthesis efficiency. As can be seen from FIG. 3, when the degree of input imbalance reaches a certain value, the synthesis efficiency of the radio-frequency power synthesizer may drop to a level low enough so that the radio-frequency power amplification module 16 is considered to be unable to operate properly at this point.

Currently, magnetic resonance systems require the application of radio-frequency amplification and radio-frequency synthesis techniques to achieve the required radio-frequency transmit power. Especially in higher field-strength magnetic resonance systems, a large peak power is required for radio-frequency emission systems.

Figure 4:
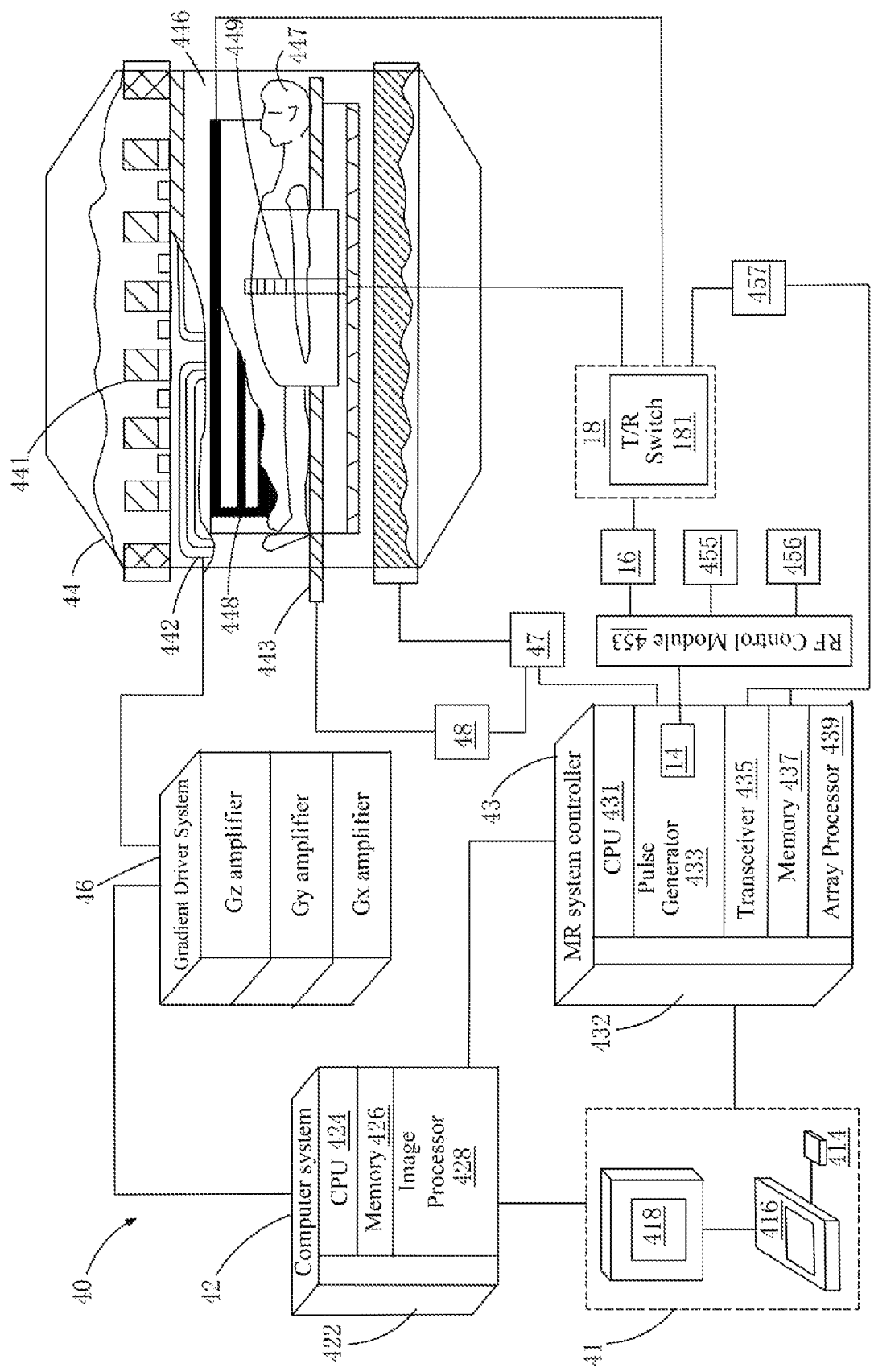
FIG. 4 illustrates a schematic diagram of an exemplary MR system 40 according to some embodiments of the present invention.

FIG. 4 illustrates a schematic diagram of an exemplary magnetic resonance (MR) system 40 according to some embodiments of the present invention. As shown in FIG. 4, the operation of the magnetic resonance system 40 is controlled by an operator workstation 41 that includes an input apparatus 414, a control panel 416, and a display 418. The input apparatus 414 may include a joystick, a keyboard, a mouse, a trackball, a touch screen, a voice control, or any similar or equivalent input apparatus. The control panel 416 may include a keyboard, a touch screen, a voice control, a button, a slider, or any similar or equivalent control apparatus. The operator workstation 41 is coupled to and in communication with a computer system 42. The computer system 42 enables the operator to control (e.g., through the input device) the generation and viewing of images and other monitoring information on the display 418, and can perform human-computer interaction through a user interface displayed on the display 418. The human-computer interaction can be used to: input information required for scanning, determine scanning parameters (e.g. determine the scanning sequence or other parameters during scanning), perform operations for image processing, select images, view the results of quality evaluation of the selected images, etc. The computer system 42 includes various components that communicate with one another via an electrical and/or data connection module 422. The connection module 422 may be a direct wired connection, a fiber optic connection, a wireless communication link, etc. The computer system 42 may include a central processing unit (CPU) 424, a memory 426, and an image processor 428. In some embodiments, the image processor 428 may be replaced by image processing functions implemented in the CPU 424. The computer system 42 may be connected to an archive media apparatus, a persistent or backup memory, or a network. The computer system 42 may be coupled to and in communication with a separate MR system controller 43.

The MR system controller 43 includes a set of components that communicate with one another via an electrical and/or data connection module 432. The connection module 432 may be a direct wired connection, a fiber optic connection, a wireless communication link, etc. The MR system controller 43 may include a CPU 431, a sequence pulse generator 433 which is in communication with the operator workstation 41, a transceiver (or an RF transceiver) 435, a memory 437, and an array processor 439.

The magnetic resonance system 40 includes a resonance assembly 44 and a housing for accommodating the resonance assembly 44 (not shown in the figure). A subject 447 to receive an MR scan may be positioned within a cylindrical imaging volume 446 of the resonance assembly 44. The resonance assembly 44 includes a superconducting magnet 441, and the resonance assembly 44 may further include a gradient coil 442 and an RF body coil 448. The superconducting coil 441 provides a static uniform longitudinal magnetic field $B_0$ through the cylindrical imaging volume 446 during operation.

The MR system controller 43 may receive a command from the operator workstation 41 to indicate a scan sequence to be executed during an MR scan.

The "scan sequence" refers to a combination of pulses having specific amplitudes, widths, directions, and time sequences, and applied when a magnetic resonance imaging scan is executed. The pulses may typically include, for example, radio-frequency pulses and gradient pulses. The radio-frequency pulses may include, for example, radio-frequency excitation pulses, radio-frequency refocusing pulses, inverse recovery pulses, etc. These radio-frequency pulses can have different amplitudes, phases, flip angles, etc. based on their different functions. The gradient pulses may include, for example, gradient pulses used for layer selection, gradient pulses used for phase encoding, gradient pulses used for frequency encoding, gradient pulses used for phase shifting (phase shift), gradient pulses used for dispersion of phases (dephasing), etc. These gradient pulses may also have different amplitudes and/or durations.

Typically, a plurality of scanning sequences can be pre-set in the magnetic resonance system, so that a sequence suitable for clinical detection requirements can be selected. The clinical detection requirements may include, for example, an imaging site, an imaging function, an imaging effect, and the like.

The radio-frequency pulses in the scan sequence indicated by the MR system controller 43 may be generated via the sequence pulse generator 433, and specifically, the pulse generator 433 may include a radio-frequency signal generation module 14. The radio-frequency signal generation module 14 may be integrated in the resonance assembly 44, for example, disposed in a magnet housing in a scan room. The radio-frequency signal generation module 14 may generate a corresponding radio-frequency pulse (radio-frequency signal) based on the description (e.g., including amplitude, frequency, etc.) of radio-frequency pulses in a predetermined (e.g., user selected) scan sequence. Said radio-frequency pulse is amplified by the radio-frequency power amplification module 16 to generate a radio-frequency power amplification signal, and then the radio-frequency pulse is provided to the RF body coil 448 or other types of radio-frequency transmitting coil via the radio-frequency power transmission module 18. In some embodiments, the radio-frequency power transmission module 18 may include a transmit/receive switch (T/R switch) 181. The T/R switch 181 is used to control the RF body coil 448 in response to a control signal from the MR system controller 43 to receive a radio-frequency power amplification signal, or to send a detected magnetic resonance signal to a radio-frequency receiving system. The RF body coil 448 generates a transverse magnetic field $B_1$ when receiving a radio-frequency power amplification signal that serves as radio-frequency excitation, and said transverse magnetic field $B_1$ is substantially perpendicular to $B_0$ in the entire cylindrical imaging volume 446.

Typically, higher field-strength magnetic resonance systems require higher radio-frequency power output, and since the amplification gain or output power of existing radio-frequency power amplifiers cannot be further increased, the employment of power synthesis techniques are needed, and more radio-frequency power amplifiers are required to be provided for higher field-strength magnetic resonance systems (e.g., 3.0 T or above). An example of the power synthesis technique is shown in FIG. 1. In some products, the radio-frequency power amplification module 16 is disposed in a limited space between the resonance assembly 44 and the housing thereof, and, usually, power amplification components need to be temperature controlled to ensure the electronic characteristics of the devices. In the product upgrade process, when there is a need to increase the number of radio-frequency power amplifiers, it is necessary to increase the area of the original circuit board used to carry the radio-frequency power amplification circuit. Accordingly, expansion of the space between the resonance assembly 44 and the housing, or rearrangement of the entire space may be required, and the area of an additional heat dissipation template is also required to avoid device heating, thereby increasing design difficulty.

The concept of the present invention includes separately disposing radio-frequency power amplification modules on at least two circuit boards, and providing a "shared" heat dissipation/cooling module for the at least two circuit boards. Meanwhile, temperature monitoring and temperature control of the at least two circuit boards are proposed to keep the temperatures of the at least two circuit boards consistent.

In some embodiments, the system controller 43 may further receive data from a detector, for example, physiological monitoring signals such as breathing, heartbeat, etc., of the examined subject, and may further receive various status monitoring signals of system components. The system controller 43 performs scan-related operational control based on the received data from the detector.

In the embodiments of the present invention, the magnetic resonance system further includes at least two temperature detection modules 455 and 456, and a radio-frequency control module 453. The at least two temperature detection modules 455 and 456 are respectively used to obtain the temperatures of the at least two circuit boards that share the same heat dissipation module. The radio-frequency control module 453 can communicate with the system controller 43 by means of an electrical connection/data connection. The radio-frequency control module 453 is used to control, based on the temperature of each circuit board, the radio-frequency power amplification circuit on the corresponding circuit board to output a radio-frequency power signal at a target temperature. The radio-frequency control module 453 can be integrated together with the radio-frequency power amplification module 16 in the resonance assembly 44. For example, the radio-frequency control module 453 may be provided on the same circuit board that carries the radio-frequency power amplification module, or may have a separate carrier. At least a portion of the radio-frequency control module 453 may also be integrated with, for example, the MR system controller 43.

The target temperature may be a temperature that enables each device of the radio-frequency power amplification module 16 to operate in a better state. For example, some devices in the radio-frequency power amplification module 16 (e.g., radio-frequency power amplifiers 163) have a temperature characteristic, according to which, when at the target temperature, these devices have a more desirable output signal characteristics or gain. If the current actual temperature differs significantly from the target temperature, the output signal characteristics or gain of the devices deteriorate. At this point, the radio-frequency control module 453 can adjust the signal characteristics input to these devices, so that the output signal of the devices has the expected signal characteristics and has a high degree of signal balance to ensure the efficiency of signal synthesis, so that the radio-frequency power amplification module 16 can achieve the desired peak power.

In some embodiments of the present invention, the temperature detection modules 455 and 456 may be provided close to the two circuit boards respectively, and, further, may be provided at locations corresponding to heat generating devices of the circuit boards (e.g., radio-frequency power amplifiers, radio-frequency power synthesizers, radio-frequency power dividers, etc.). The at least two circuit boards carrying the radio-frequency power amplification circuits and the heat dissipation module therefor (e.g., a cooling plate) may be provided in a scan room, such as in a housing for mounting the resonance assembly 44.

A gradient waveform in the scan sequence indicated by the MR system controller 43 may be generated via the sequence pulse generator 433 and provided to the gradient driver system 46, and the gradient driver system 46 includes $G_x$, $G_y$ and $G_z$ amplifiers, etc. Each $G_x$, $G_y$, and $G_z$ gradient amplifier excites a corresponding gradient coil in the gradient coil assembly 442, so as to generate a magnetic field gradient used to spatially encode an MR signal during an MR scan.

The sequence pulse generator 433 is coupled to and in communication with a scan room interface system 47, and the scan room interface system 47 can receive signals from various sensors associated with the state of the resonance assembly 44 and various processors provided in the scan room. The scan room interface system 47 is further coupled to and in communication with a patient positioning system 48 that sends and receives signals to control a patient table 443 to move to a desired location to perform an MRI scan. In some embodiments, the sequence pulse generator 433 may be integrated into the resonance assembly 44 of the magnetic resonance system 40.

The resonance assembly 44 may further include an RF surface coil 449 for imaging different anatomical structures of the patient undergoing the MR scan. The RF body coil 448 and the RF surface coil 449 may be configured to operate in a transmit and receive mode, a transmit mode, or a receive mode.

As described above, the RF body coil 448 and the RF surface coil 449 may be used to transmit RF excitation pulses and/or receive resulting MR signals from the patient undergoing the MR scan. The MR signals emitted by excited nuclei in the patient of the MR scan may be sensed and received by the RF body coil 448 or the RF surface coil 449 and sent back to a preamplifier 46 through the T/R switch 181. The T/R switch 181 may be controlled by a signal from the MR system controller 43 to electrically connect the radio-frequency power amplification module 16 to the RF body coil 448 in the transmit mode, and to connect the preamplifier 46 to the RF body coil 448 in the receive mode.

In some embodiments, the magnetic resonance signals sensed and received by the RF body coil 448 or the RF surface coil 449 and amplified by the preamplifier 457 are stored in the memory 437 for post-processing as a raw k-space data array. A reconstructed magnetic resonance image may be obtained by transforming/processing the stored raw k-space data.

In some embodiments, the magnetic resonance signals sensed and received by the RF body coil 448 or the RF surface coil 449 and amplified by the preamplifier 457 are demodulated, filtered, and digitized in a receiving portion of the transceiver 435, and transmitted to the memory 437 in the MR system controller 43. For each image to be reconstructed, the data are rearranged into separate k-space data arrays, and each of these separate k-space data arrays is inputted into the array processor 439, which is operated to convert the data into an array of image data by Fourier transform.

The array processor 439 uses transform methods, most commonly Fourier transform, to create images from the received MR signals. These images are transmitted to the computer system 42 and stored in the memory 426. In response to commands received from the operator workstation 41, the image data may be stored in a long-term memory, or may be further processed by the image processor 428 and transmitted to the operator workstation 41 to be displayed on the display 418.

In various embodiments, components of the computer system 42, the MR system controller 43 and radio-frequency control module 453 may be implemented in the same computer system or in a plurality of computer systems. It should be understood that the MR system 40 shown in FIG. 4 is intended for illustration. Suitable MRI systems may include more, fewer, and/or different components.

The MR system controller 43, the computer system 42 and the radio-frequency control module 453 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the radio-frequency signal synthesis method according to the embodiments of the present invention. The storage medium may include, for example, a ROM, a floppy disk, a hard disk, an optical disk, a magneto-optical disk, a CD-ROM, or a non-volatile memory card.

Figure 5:
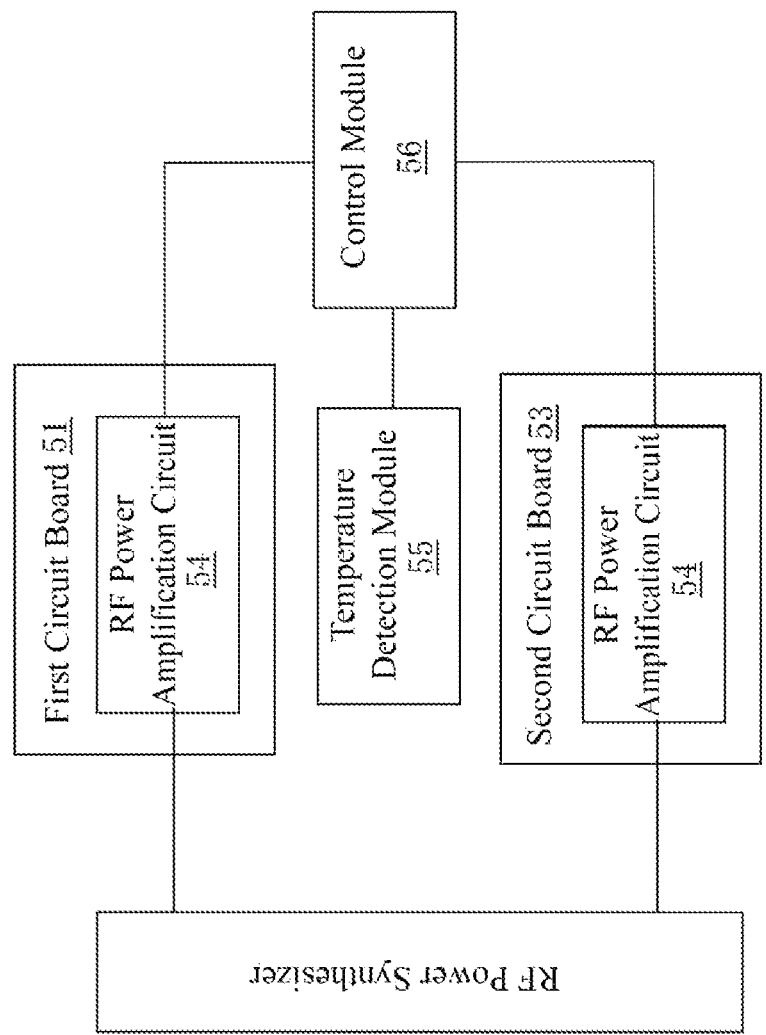
FIG. 5 illustrates a block diagram of a radio-frequency power output device 50 according to some embodiments of the present invention.
Figure 6:
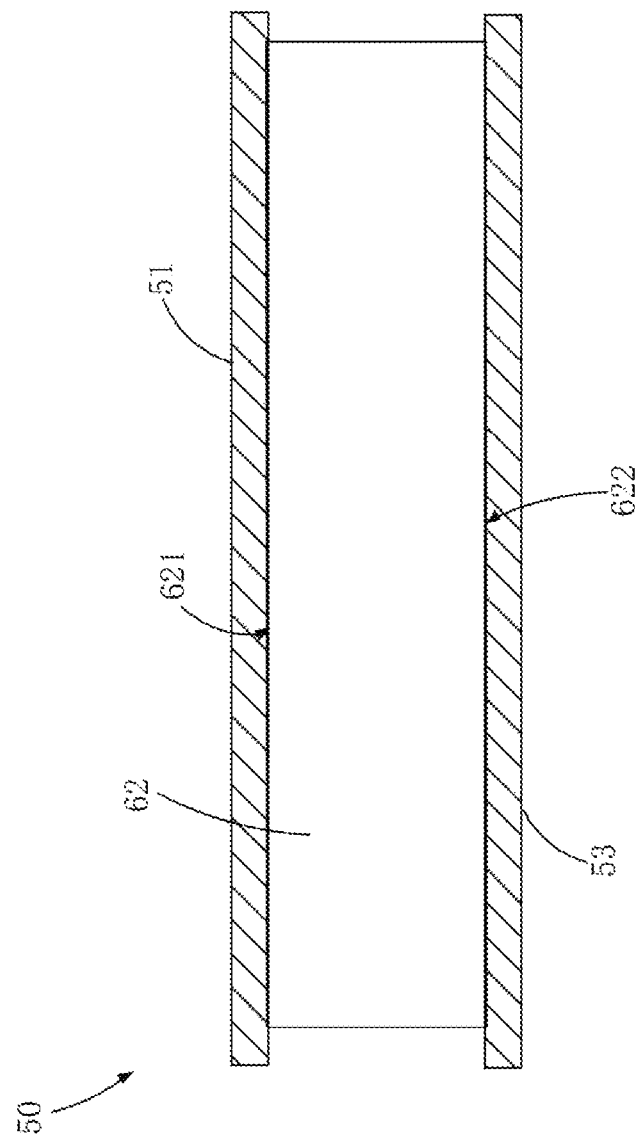
FIG. 6 illustrates a schematic cross-sectional view of the radio-frequency power output device 50 according to some embodiments of the present invention.

FIG. 5 illustrates a block diagram of a radio-frequency power output device 50 according to some embodiments of the present invention, and FIG. 6 illustrates a schematic cross-sectional view of the radio-frequency power output device 50 according to some embodiments of the present invention. As shown in FIGS. 5 and 6, the radio-frequency power output device 50 includes a cooling plate 62 which has two opposite sides 621 and 622. The cooling plate 62 has a first circuit board 51 and a second circuit board 53 provided on the two opposite sides 621 and 622 respectively, and each of the first circuit board 51 and the second circuit board 53 is provided with a radio-frequency power amplification circuit 54.

The radio-frequency power output device 50 further includes a temperature detection module 55 and a control module 56. The temperature detection module 55 is used to obtain the temperature of the first circuit board 51 and the temperature of the second circuit board 53, and the control module 56 is used to control, based on the temperature of the first circuit board 51, the radio-frequency power amplification circuit 54 of the first circuit board 51 to output a radio-frequency power signal at a target temperature, and to control, based on the temperature of the second circuit board 53, the radio-frequency power amplification circuit 54 of the second circuit board 53 to output a radio-frequency power signal at the target temperature.

In the above solution, by respectively disposing the radio-frequency power amplification circuits 54 on the two circuit boards, there is no need to increase the original size of the circuit board for accommodation when the number of devices in the radio-frequency power amplification circuit 54 is large or the circuit area is large. By disposing the two circuit boards on the two opposite sides of the cooling plate, only a single cooling plate is used to provide heat dissipation for both of the circuit boards at the same time, thereby further saving space. Temperature detection is performed on the first circuit board 51 and the second circuit board 53 respectively, and the output of the radio-frequency power amplification circuit 54 of the corresponding circuit board is controlled according to the detected temperature by the control module 56, such that the signal level at the target temperature can be reached, thereby reducing the output power drop resulting from temperature differences between the two circuit boards.

In some embodiments, the first circuit board 51 and the second circuit board 53 at least have symmetrical portions with respect to each other. For example, the symmetrical portion is used to arrange the corresponding radio-frequency power amplification circuits 54. In this way, environmental differences between the radio-frequency power amplification circuits 54 of the two circuit boards are reduced, and the consistency of signal characteristics is improved.

In some embodiments, the first circuit board 51 and the second circuit board 53 may have asymmetrical portions, and the asymmetrical portions may be used to arrange any desired circuitry or components. The cooling plate 62 may not be arranged on the asymmetrical portions of the first circuit board 51 and the second circuit board 62. For example, the cooling plate 62 may not extend to the location of the additional circuitry.

Figure 7:
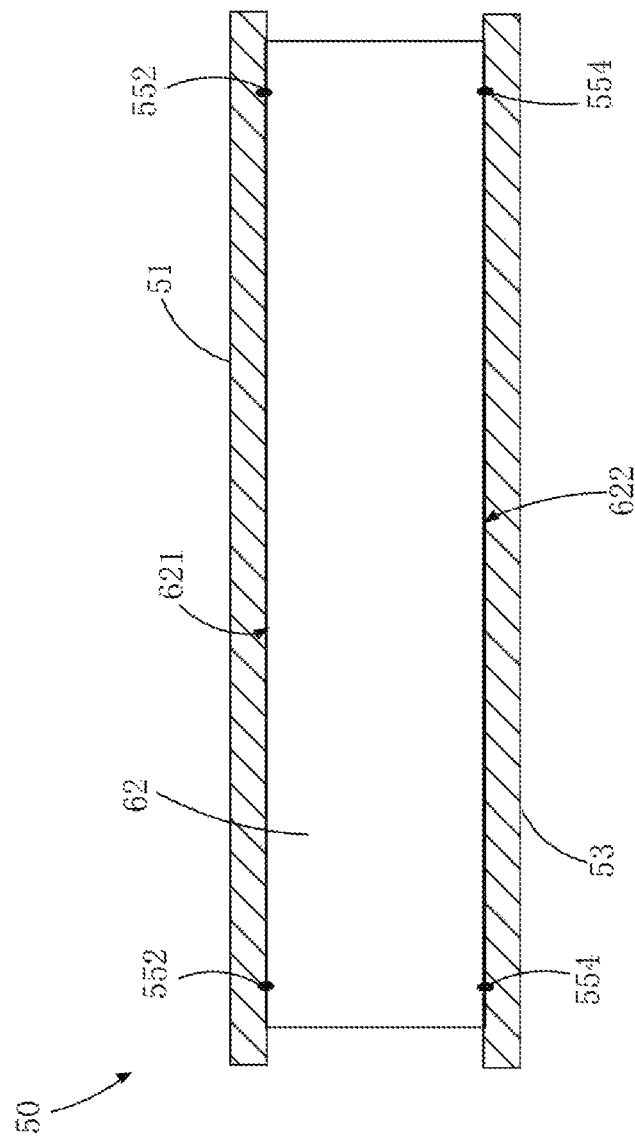
FIG. 7 illustrates a schematic cross-sectional view of the radio-frequency power output device 50 according to some other embodiments of the present invention.

FIG. 7 illustrates a schematic cross-sectional view of a radio-frequency power output device according to some other embodiments of the present invention. The temperature detection module 55 includes a first temperature detector 552 and a second temperature detector 554, and the first temperature detector 552 may output a first temperature based on temperature detection of the first circuit board 51 and the second temperature detector 554 may output a second temperature based on temperature detection of the second circuit board 53. The "temperature of the first circuit board 51" can be generated based on the first temperature, and the "temperature of the second circuit board" can be generated based on the second temperature. For example, the first temperature and second temperature can be directly used as the temperature of the corresponding circuit board, or results obtained by a predetermined mathematical operation can be respectively used as the temperature of the corresponding circuit board. One embodiment of the first temperature detector 552 and the second temperature detector 554 may include a temperature sensor, or other temperature detection techniques may be applied to achieve temperature detection of the first circuit board 51 and the second circuit board 53.

In some embodiments, the first temperature detector 552 includes a portion in contact with the one side 621 of the cooling plate 62 to be sufficiently close to the cooling plate 62, such that the detected temperature is as relevant as possible to the temperature environment in which the circuit board and the devices thereof are located. The first temperature detector 552 further includes a portion in contact with the first circuit board 51 to facilitate circuit layout arrangement on the first circuit board 51. Similarly, the second temperature detector 554 includes a portion in contact with the other side 622 of the cooling plate 62 and a portion in contact with the second circuit board 53.

In some embodiments, the first temperature detector 552 is provided between the cooling plate 62 and the first circuit board 51, and the second temperature detector 554 is provided between the cooling plate 62 and the second circuit board 53. For example, both the first temperature detector 552 and the second temperature detector are embedded in the cooling plate 62, with the first temperature detector 552 embedded in or passing through the first circuit board 51 and the second temperature detector 554 embedded in or passing through the second circuit board 53.

In some embodiments, the first temperature detector 552 and the second temperature detector 554 are symmetrically disposed with respect to the cooling plate 62 to output the temperature at the corresponding location, so that the control module 56 controls the radio-frequency power amplification circuits 54 based on consistent temperature feedback conditions, thereby further ensuring the consistency of signal characteristics of the two sides.

In some embodiments, both the first temperature detector 552 and the second temperature detector 554 are disposed close to the radio-frequency power amplifiers in the corresponding radio-frequency power amplification circuit, thus allowing the obtainable temperature to be closer to the actual temperature of the radio-frequency power amplifiers, thereby achieving more accurate control of the radio-frequency power amplifiers.

In some embodiments, the control module 56 is used to control, based on the temperature of the first circuit board 51 and pre-stored temperature characteristics of the radio-frequency power amplifiers, the phase and amplitude of the first radio-frequency power input signal input into the radio-frequency power amplification circuit (i.e., the first radio-frequency power amplification circuit) 54 of the first circuit board 51. The control module 56 is further used to control, based on the temperature of the second circuit board 53 and the pre-stored temperature characteristics of the radio-frequency power amplifiers, the phase and amplitude of the second radio-frequency power input signal input into the radio-frequency power amplification circuit (i.e., the second radio-frequency power amplification circuit) 54 of the second circuit board 53.

The "temperature characteristics" include the feature in which signal characteristics output by the radio-frequency power amplifier change along with changes in temperature. The range of the "temperature" can include the actual temperature that can be detected by the temperature detection module 55, and further include the target temperature, i.e., the temperature at which the first circuit board 51 and the second circuit board 53 can operate in a better state. In the embodiments of the present invention, the "signal characteristics" include at least one of the amplitude and phase of the output signal from the radio-frequency power amplifier.

Figure 8:
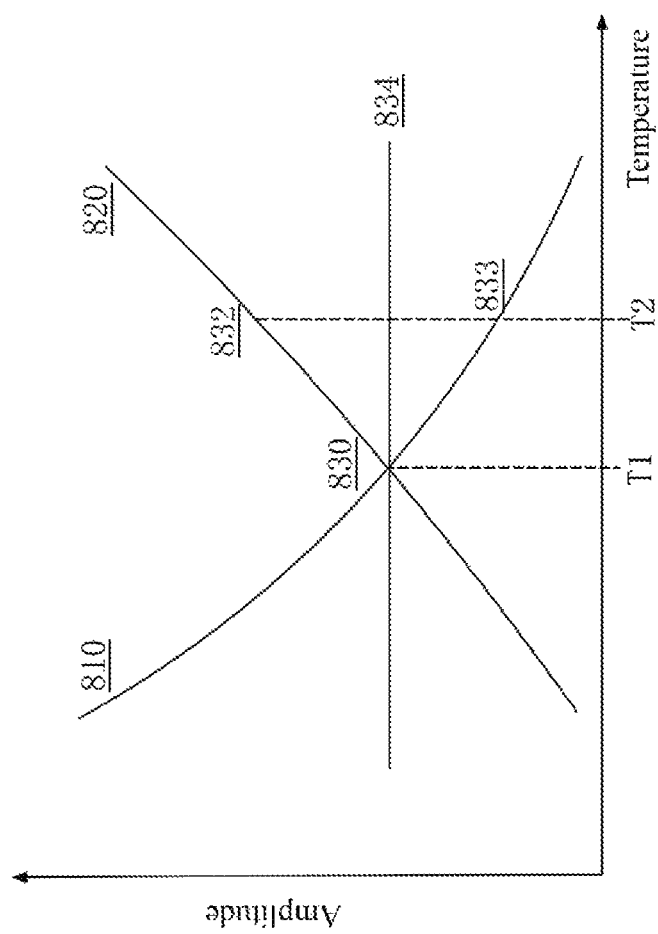
FIG. 8 schematically illustrates an example of controlling output signal characteristics of a radio-frequency power amplification circuit based on an actual temperature and temperature characteristics of radio-frequency power amplifiers.

FIG. 8 schematically illustrates an example of controlling output signal characteristics of a radio-frequency power amplification circuit based on an actual temperature and temperature characteristics of radio-frequency power amplifiers, the actual temperature being the temperature of the first circuit board 51 or the temperature of the second circuit board 53 obtained by the temperature detection module 55. As shown in FIG. 8, the curve 810 represents the amplitude-temperature characteristics of the radio-frequency power amplifiers in the radio-frequency power amplification circuit 54, with the x-coordinate representing the temperature of the radio-frequency power amplifier and the y-coordinate representing the amplitude gain of the radio-frequency power amplifier. As can be seen from FIG. 8, when the input signal is the same, the amplitude of the output signal of the radio-frequency power amplifier gradually decreases as the temperature increases, i.e., the gain of the radio-frequency power amplifier decreases as the temperature increases. The curve 820 represents the amplitude gain for the radio-frequency signal through adjustment before the radio-frequency signal is input into the radio-frequency power amplifier. The temperature T1 corresponding to the point 830 on the curves 820 and 810 is the standard temperature, also known as the target temperature, and the point 830 and the straight line 834 in which the point is located correspond to the target amplitude gain.

Assuming that the temperature T2 corresponding to the point 832 on the curve 820 and the point 833 on the curve 810 is the current actual temperature, said actual temperature may be the temperature of the first circuit board 51 or the temperature of the second circuit board 53 as detected by the temperature detection module 55. Then, according to the curve 810, the amplitude gain at the actual temperature decreases compared with the target amplitude gain. At this point, based on the target amplitude gain and the actual amplitude gain at the point 833, the amplitude of the input signal of the radio-frequency power amplifier can be increased (e.g., adjust the amplitude of the input signal according to the curve 820) so that the amplitude of the output signal is maintained at the target amplitude when the gain of the radio-frequency power amplifier decreases.

Phase control of the radio-frequency power signal output from the radio-frequency power amplification circuit has a similar principle as the amplitude control described above. For example, the phase of the output signal of the radio-frequency power amplifier is gradually shifted as the temperature increases. If the phase at the actual temperature has a phase shift $\Delta\Phi$ compared with the phase at the target temperature, the phase of the input signal of the radio-frequency power amplifier can be made to shift by $-\Delta\Phi$, and the phase of the output signal is maintained at the phase at the target temperature.

Figure 9:
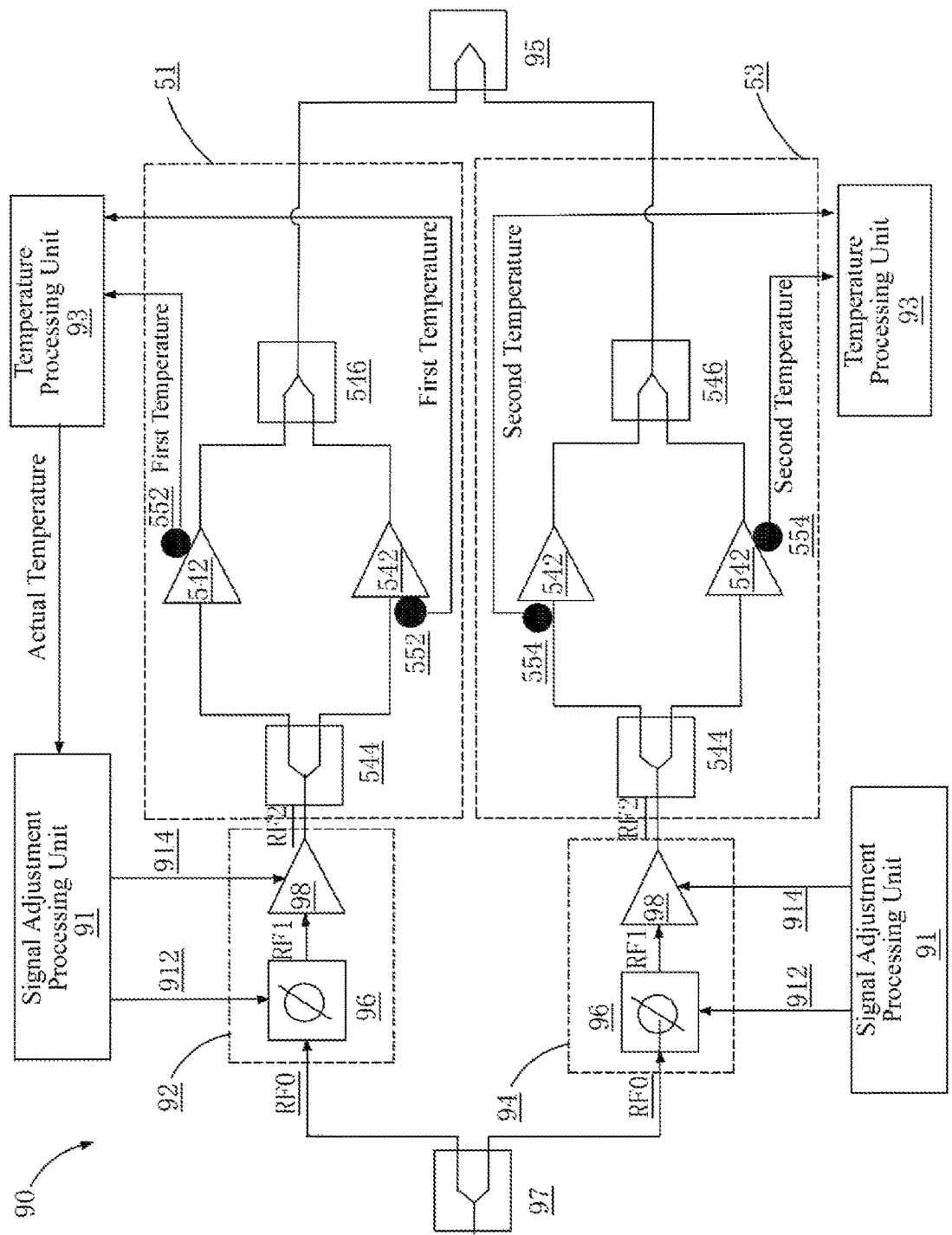
FIG. 9 illustrates a schematic block diagram of a radio-frequency power output device 90 according to some other embodiments of the present invention.

FIG. 9 illustrates a schematic block diagram of a radio-frequency power output device 90 according to some other embodiments of the present invention, wherein the radio-frequency power amplification circuits 54 arranged on the first circuit board 51 and the second circuit board 53 may have a similar structure to that of the radio-frequency power amplification module 16 shown in FIG. 1. For example, the radio-frequency power amplification circuit 54 may include a plurality of radio-frequency power amplifiers 542, and may further include a radio-frequency power divider 544 for power distribution and a first radio-frequency power synthesizer 546 for power synthesis. In the embodiments of the present invention, there is no limitation on the number and arrangement of the individual devices in the radio-frequency power amplifier 542.

The control module 56 includes a first control circuit 92 and a second control circuit 94. The first control circuit 92 and the second control circuit 94 are used to adjust signal characteristics of the radio-frequency power input signals input into the radio-frequency power amplification circuits 54 of the first circuit board 51 and the second circuit board 54 respectively. The radio-frequency power input signals may be power signals distributed to the radio-frequency power amplification circuits 54 on the first circuit board 51 and the second circuit board 53 respectively via a radio-frequency power divider 97.

Each of the first control circuit 92 and the second control circuit 94 includes a phase adjuster 96 and an amplitude adjuster 98. The phase adjuster 96 includes an input terminal, a control terminal and an output terminal. The input terminal of the phase adjuster 96 is used to receive a radio-frequency power input signal RF0 to be adjusted, the control terminal of the phase adjuster 96 is used to receive a corresponding phase adjustment signal 912, and the phase adjuster 96 is used to adjust, based on the received phase adjustment signal 912, the phase of the radio-frequency power input signal RF0, and then output a radio-frequency power signal RF1 through the output terminal thereof.

The amplitude adjuster 98 includes an input terminal, a control terminal and an output terminal. The input terminal of the amplitude adjuster 98 is used to receive the corresponding phase-adjusted radio-frequency power input signal (radio-frequency power signal RF1), the control terminal of the amplitude adjuster 98 is used to receive a corresponding amplitude adjustment signal 914, and the amplitude adjuster 98 is used to adjust the amplitude of the radio-frequency power signal RF1 based on the received amplitude adjustment signal 914, and then send a radio-frequency power signal RF2 to each input terminal of the radio-frequency power amplification circuit 54 on the corresponding first circuit board 51 or second circuit board 53.

In other embodiments, the radio-frequency power input signal can also be amplitude-adjusted first and then phase-adjusted.

In some embodiments, the phase adjuster may include a phase shifter having a control terminal for receiving a control voltage. The greater the absolute value of the control voltage, the greater the phase shift.

In some embodiments, the amplitude adjuster includes a variable gain amplifier having a control terminal for receiving a control voltage to enable the variable gain amplifier to have a corresponding amplification gain, thereby enabling the desired radio-frequency power input signal to be output to the radio-frequency power amplification circuit of the first or second circuit board based on the gain adjustment.

The control module 56 further includes a signal adjustment processing unit 91 which is used to generate the phase adjustment signal 912 and amplitude adjustment signal 914 for the first control circuit 92 based on the temperature of the first circuit board 51 and the temperature characteristics of the radio-frequency power amplifiers. The signal adjustment processing unit 91 is further used to generate the phase adjustment signal 912 and amplitude adjustment signal 914 for the second control circuit 94 based on the temperature of the second circuit board 53 and the temperature characteristics of the radio-frequency power amplifiers. The signal adjustment processing unit 91 sends the generated phase adjustment signals 912 and amplitude adjustment signals 914 to the corresponding radio-frequency power amplification circuit 54 of the first circuit board 51 and the radio-frequency power amplification circuit 54 of the second circuit board 53.

As an example, the signal adjustment processing unit 91 may obtain the corresponding phase adjustment signal 912 and amplitude adjustment signal 914 based on the principle shown in FIG. 8. For example, the temperature range of the pre-stored temperature characteristics of the radio-frequency power amplifiers may include the actual temperatures of the first circuit board and the second circuit board that can be obtained by the temperature detection module 55 as well as the above target temperature. The signal adjustment processing unit 91 may receive predetermined reference characteristic values (e.g., signal amplitude/gain at the target temperature and signal phase at the target temperature), and the signal adjustment processing unit 91 may also obtain the signal characteristic values at the actual temperature based on the temperature characteristics, and obtain the corresponding phase adjustment signal 912 and amplitude adjustment signal 914 by obtaining the differences between the characteristic values at the target temperature and the actual temperature.

As previously described, the temperature of the first circuit board 51 may be a first temperature obtained by a first temperature detector 552, or may be a temperature value obtained by performing an appropriate mathematical operation on the first temperature. The temperature of the second circuit board 53 may be a second temperature obtained by a second temperature detector 554, or may be a temperature value obtained by performing an appropriate mathematical operation on the second temperature. For example, the temperature detection module 55 includes a plurality of first temperature detectors 552 and a plurality of second temperature detectors 554, and the plurality of first temperature detectors 552 may generate a plurality of first temperatures based on temperature-sensing detection of the first circuit board 51, and the plurality of second temperature detectors 554 may generate a plurality of second temperatures based on temperature-sensing detection of the second circuit board 53.

As shown in FIG. 9, in some embodiments, the temperature detection module 55 further includes a temperature processing unit 93 for obtaining an average value of the plurality of first temperatures output by the plurality of first temperature detectors 552 and for obtaining an average value of the plurality of second temperatures output by the plurality of second temperature detectors 554. The temperature processing unit 93 is used to transmit the average value of the plurality of first temperatures to the control module 56 as the temperature of the first circuit board, and to transmit the average value of the plurality of second temperatures to the control module 56 as the temperature of the second circuit board. The control module 56 then controls, based on the average value of the temperatures, the radio-frequency power amplification circuit 54 of the corresponding circuit board to output a radio-frequency power signal at the target temperature.

The control module 56 as a whole can be integrated with the resonance assembly 44, for example, disposed on the first circuit board 51, the second circuit board 53, or a separate third circuit board (not shown in the figure). In other embodiments, the first temperature detector 552 and the second temperature detector 554 may be provided close to the first circuit board and the second circuit board respectively, and connected to the first control circuit 92 and the second control circuit 94 respectively. It should be understood by those skilled in the art that the first temperature detector 552 and the second temperature detector 554 may be part of the first control circuit 92 and the second control circuit 94 respectively. The first control circuits 92 and 94 may be integrated with the resonance assembly 44, and at least one of the signal adjustment processing unit 91 and the temperature processing unit 93 may be integrated with the system controller 43 or other computer processing modules. The signal adjustment processing unit 91 and the temperature processing unit 93 can communicate with other circuits/modules/units of the control module 56 by means of, for example, an electrical connection or a data connection.

As shown in FIG. 9, the radio-frequency power output device of the embodiment of the present invention further includes a radio-frequency power divider 97, which is used to distribute the radio-frequency power input signal RF0 to the radio-frequency power amplification circuits on the first circuit board 51 and the second circuit board 53 respectively.

The radio-frequency power output device of the embodiment of the present invention further includes a second radio-frequency power synthesizer 95, which is used to synthesize the radio-frequency power signals output from the radio-frequency power amplification circuits 54 on the first circuit board 51 and the second circuit board 53 and then output the same to the outside. In some embodiments, the radio-frequency power signal output via the second power synthesizer 95 can be sent to the radio-frequency coil of the magnetic resonance system via the radio-frequency transmission module 18.

Figure 10:
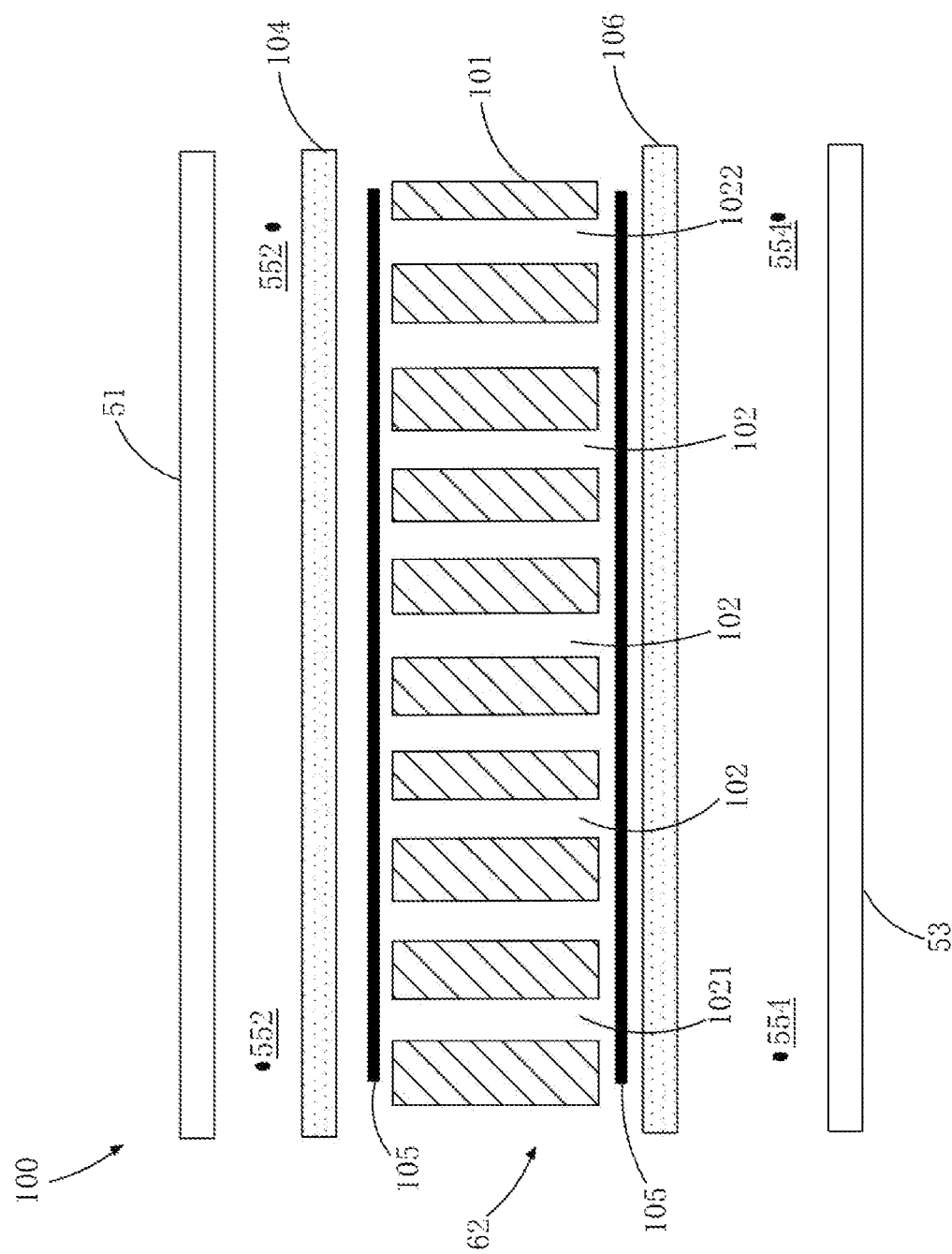
FIG. 10 illustrates a schematic exploded view of a radio-frequency power output device 100 according to some other embodiments of the present invention.

FIG. 10 illustrates a schematic exploded view of a radio-frequency power output device 100 according to some other embodiments of the present invention, wherein the cooling plate 62 includes a body plate 101 and a cooling channel 102 provided in the body plate 101. The cooling channel 102 is used to store or circulate a cooling medium, which can include water, air or other media.

The cooling channel 102 passes through the body plate 101. The cooling plate 62 further includes a first spacer 104 provided between the body plate 101 and the first circuit board 51 and a second spacer 106 provided between the body plate 101 and the second circuit board 53, so as to isolate the cooling channel 102 from the first circuit board 51 and the second circuit board 53 respectively.

A sealing device 105 is provided between the first spacer 104 and the body plate 101 and between the second spacer 106 and the body plate 101 respectively to further avoid leakage of the cooling medium in the cooling channel 102.

By providing a cooling channel passing through two sides of the cooling plate 101, the temperatures of the first circuit board 51 and the second circuit board 53 on two sides of the cooling plate 62 can be more consistent, so that the degrees of temperature detection-based adjustment of the radio-frequency power signals on the two sides can be more consistent. At the same time, such method has problems such as high manufacturing process loads and high costs, and has the hidden risk of cooling medium leakage.

Figure 11:
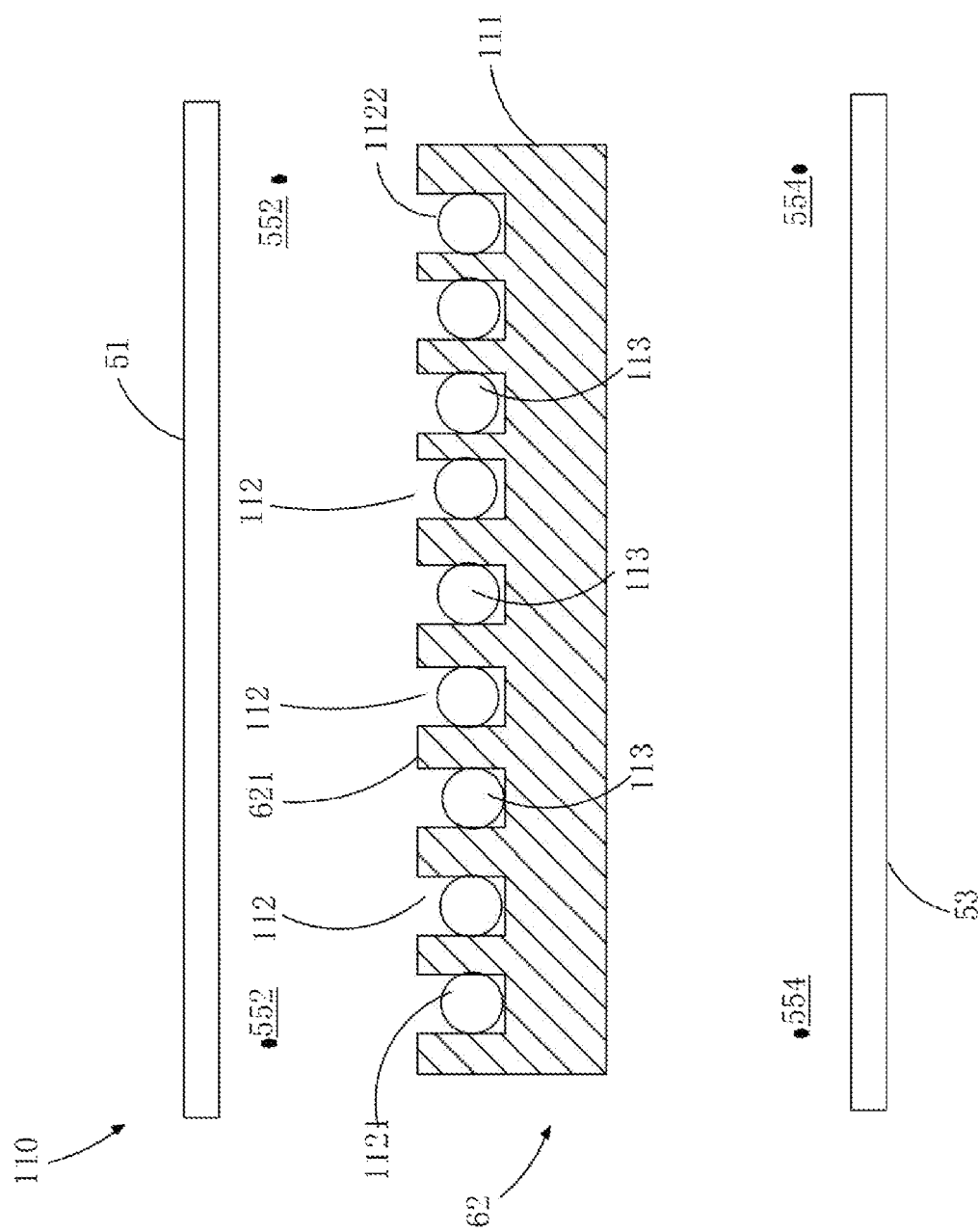
FIG. 11 illustrates a schematic exploded view of a radio-frequency power output device 110 according to some other embodiments of the present invention.

FIG. 11 illustrates a schematic exploded view of a radio-frequency power output device 110 according to some other embodiments of the present invention, wherein the cooling plate 62 includes a body plate 111 and a cooling channel 112 provided in the body plate 111. The cooling channel includes a recess in connection with one side 621 of the cooling plate 62 and a cooling tube 113 provided in the recess for storing or circulating a cooling medium which may include water, air or other media. An example of the cooling tube 113 is a copper tube.

As shown in FIGS. 10 and 11, the cooling channels 102 and 112 include cooling medium inlets 1021 and 1121 and cooling medium outlets 1022 and 1122, respectively. It should be understood that a cooling medium with lower temperature can flow through the cooling medium inlet 1021 or 1121 through the cooling channel 102 or 112 to absorb the heat emitted by the heat generating devices (such as the components in the radio-frequency power amplification circuit 54) that are disposed near the cooling channel 102 or 112, so that the cooling medium with higher temperature flows out through the cooling medium outlet 1022 or 1122. In some embodiments, the cooling medium inlet 1021 or 1121 and the cooling medium outlet 1022 or 1122 may be provided on the same side or on opposite sides of the cooling plate 62.

As shown in FIGS. 9, 10, and 11, a plurality of first temperature detectors 552 and a plurality of second temperature detectors 554 may be provided along the cooling channel 102 or 112 in the embodiments of the present invention. For example, the first temperature detector 552 and the second temperature detector 554 may be provided at least at both the cooling medium inlet 1021 or 1121 and the cooling medium outlet 1022 or 1122. In this way, signal adjustment/control can be performed on the radio-frequency power amplification circuits on both circuit boards based on temperature values close to the actual temperature, so as to further improve the consistency/balance of the signal characteristics. Of course, it is possible to provide only one first temperature detector 552 and one second temperature detector 554 when cost savings and simplified circuit layout are taken into consideration, or overly precise control is not required.

Figure 12:
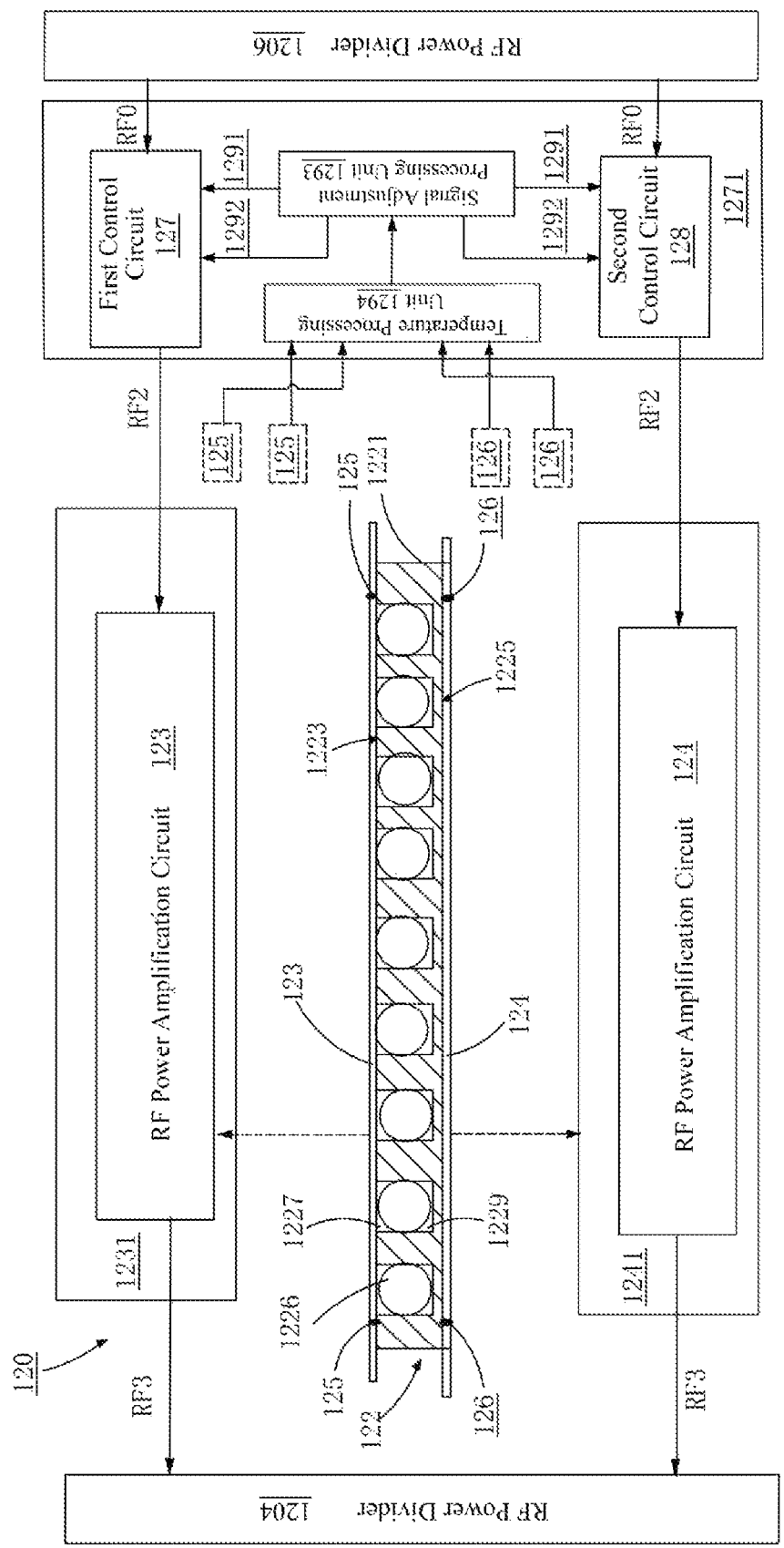
FIG. 12 illustrates a schematic block diagram of a radio-frequency power output device 120 according to some other embodiments of the present invention.

FIG. 12 illustrates a radio-frequency power output device 120 for a magnetic resonance system according to some other embodiments of the present invention. The device 120 may have a similar structure and operating principle to those of one or more previous embodiments. The device 120 includes a cooling plate 122. The cooling plate 122 includes a body plate 1221 having opposite first side 1223 and second side 1225, and a cooling recess 1227 provided in the body plate 1221. The cooling recess 1227 includes an opening provided at the first side 1223 of the body plate 1221 and a bottom portion 1229 disposed opposite to the opening, and the bottom portion is located between the first side 1223 and the second side 1225 of the body plate 1221. The cooling recess 1227 may have a similar structure to the recess in FIG. 11, for example, to accommodate the cooling tube 1226.

The device 120 further includes two radio-frequency power amplification circuits 123 and 124, which are symmetrically disposed on the first side 1223 and the second side 1225 of the body plate 1221 respectively. Each of the radio-frequency power amplification circuits 123 and 124 is used to receive the radio-frequency power input signal RF2 after adjustment of the distributed radio-frequency power input signal RF0. Each of the radio-frequency power amplification circuits 123 and 124 may have a similar structure to those of the radio-frequency power amplification circuits 12 and 54 of the above embodiments.

The device 120 further includes a first temperature detector 125 and a second temperature detector 126. The first temperature detector 125 is used to obtain the temperature of the first side 1223 of the body plate 1221, and the second temperature detector 126 is used to obtain the temperature of the second side 1225 of the body plate 1221. In this way, the ambient temperatures of the two radio-frequency power amplification circuits 123 and 124 can be obtained, respectively.

The device 120 further includes a first control circuit 127 and a second control circuit 128 which are connected to the radio-frequency power amplification circuits 123 and 124 respectively, and are used to control the corresponding radio-frequency power amplification circuits 123 and 124 to output a radio-frequency power signal at the target temperature in response to the received signal characteristic adjustment signal. The signal characteristic adjustment signal received by the first control circuit 127 is generated based on the temperature of the first side 1223 of the body plate 1221, and the signal characteristic adjustment signal received by the second control circuit 128 is generated based on the temperature of the second side 1225 of the body plate 1221.

The signal characteristic adjustment signal may include a phase adjustment signal and an amplitude adjustment signal, and each of the first control circuit 127 and the second control circuit 128 may include an amplitude adjuster and a phase adjuster. The phase adjuster is used to receive the corresponding phase adjustment signal 1291 and to adjust, based on the received phase adjustment signal 1291, the phase of the radio-frequency power input signal RF0 input into the corresponding radio-frequency power amplification circuit 123 or 124. The amplitude adjuster is used to receive the corresponding amplitude adjustment signal 1292 and to adjust, based on the received amplitude adjustment signal 1292, the amplitude of the radio-frequency power input signal RF0 input into the corresponding radio-frequency power amplification circuit.

In the embodiment of the present invention, the order of phase and amplitude adjustment of radio-frequency power input signal RF0 is not limited. For example, the phase adjustment of radio-frequency power input signal RF0 can be performed first, and then the amplitude adjustment of radio-frequency power signal RF0 is performed after the phase adjustment; or, the amplitude adjustment of radio-frequency power input signal RF0 can be performed first, and then the phase adjustment of radio-frequency power signal RF0 is performed after the amplitude adjustment.

The device 120 can further include a signal adjustment processing unit 1293, which is used to generate the phase adjustment signal 1291 and amplitude adjustment signal 1292 as described above. The specific principle can be similar to the signal adjustment processing unit 91, which will not be repeated herein.

The cooling tube 1226 may include a cooling medium inlet and a cooling medium outlet, wherein at least one of the cooling medium inlet and the cooling medium outlet is provided with a first temperature detector 125 located at a first side 1223 of the body plate 1221 and a second temperature detector 126 located at a second side 1225 of the body plate 1221. In the embodiment of the present invention, a plurality of first temperature detectors 125 and a plurality of second temperature detectors 126 may be provided respectively. For example, a plurality of first temperature detectors 125 are provided at the cooling medium inlet and the cooling medium outlet respectively, and a plurality of second temperature detectors 126 are provided at the cooling medium inlet and the cooling medium outlet respectively.

The device 120 may further include a temperature processing unit 1294 that is used to obtain an average value of the plurality of first temperatures obtained by the plurality of first temperature detectors 125 based on temperature sensing, and an average value of the plurality of second temperatures obtained by the plurality of second temperature detectors 126 based on temperature sensing. In the embodiments of the present invention, the temperature of the first side 1223 of the body plate 1221 is an average value of the plurality of first temperatures, and the temperature of the second side 1225 of the body plate 1221 is an average value of the plurality of second temperatures.

The embodiments of the present invention further include carriers 1231 and 1241 respectively, which are used to carry radio-frequency power amplification circuits 123 and 124 respectively. The carrier 1231 is attached to the first side 1223 of the body plate 1221 and the carrier 1241 is attached to the second side 1225 of the body plate 1221. In this embodiment, the carriers 1231 and 1241 may be the above first circuit board 51 or second circuit board 53 respectively.

In an embodiment of the present invention, a carrier 1271 is further included for carrying the first control circuit 127 and second control circuit 128, and as an optional embodiment, the signal adjustment processing unit 1293 may also be provided on the carrier 1271. An example of the carriers 1231, 1241 and 1271 includes a printed circuit board. The carrier 1271 may be independent of the carriers 1231 and 1241, and may also be part of either of the carriers 1231 and 1241.

The temperature detector 125 may be provided on the carrier 1231 or at least partially provided between the body plate 1221 and the carrier 1231. The temperature detector 126 may be provided on the carrier 1241 or at least partially provided between the body plate 1221 and the carrier 1241.

The device 120 may further include a radio-frequency power synthesizer 1204 connected to the output terminals of the radio-frequency power amplification circuits 123 and 124, and a radio-frequency power divider 1206 connected to the input terminals of the radio-frequency power amplification circuits 123 and 124. The radio-frequency power divider 1206 is used to output the radio-frequency power input signal RF0, and the radio-frequency power synthesizer 1204 is used to receive the radio-frequency power output signal RF3 output by the radio-frequency power amplification circuits 123 and 124 for power synthesis, and the synthesized radio-frequency power signal can be sent to the radio-frequency coil of the magnetic resonance system.

The radio-frequency power divider 1206 and the radio-frequency power synthesizer 1204 can be provided on any of the carriers respectively.

In the above embodiments of the present invention, by providing a circuit module with radio-frequency amplifiers on each side of a cooling plate, it is not necessary to increase the area of the cooling plate to adapt to the increased number of devices in the circuit module or the increased area of the circuitry. By disposing the two radio-frequency power amplification circuits on two opposite sides of the cooling plate, only a single cooling plate is used to provide heat dissipation for both circuits at the same time, thereby further saving space. It is possible to provide a cooling recess only on one side of the cooling plate, which is a simple and low-cost process, and it is not easy for a cooling medium to leak. The actual temperatures on both sides are respectively detected by the temperature detectors at both sides, such that the radio-frequency output signals of two radio-frequency power amplification circuits can be controlled to be more consistent in terms of signal characteristics, thereby ensuring the subsequent synthesis power of the signal and outputting the required radio-frequency power.

Figure 13:
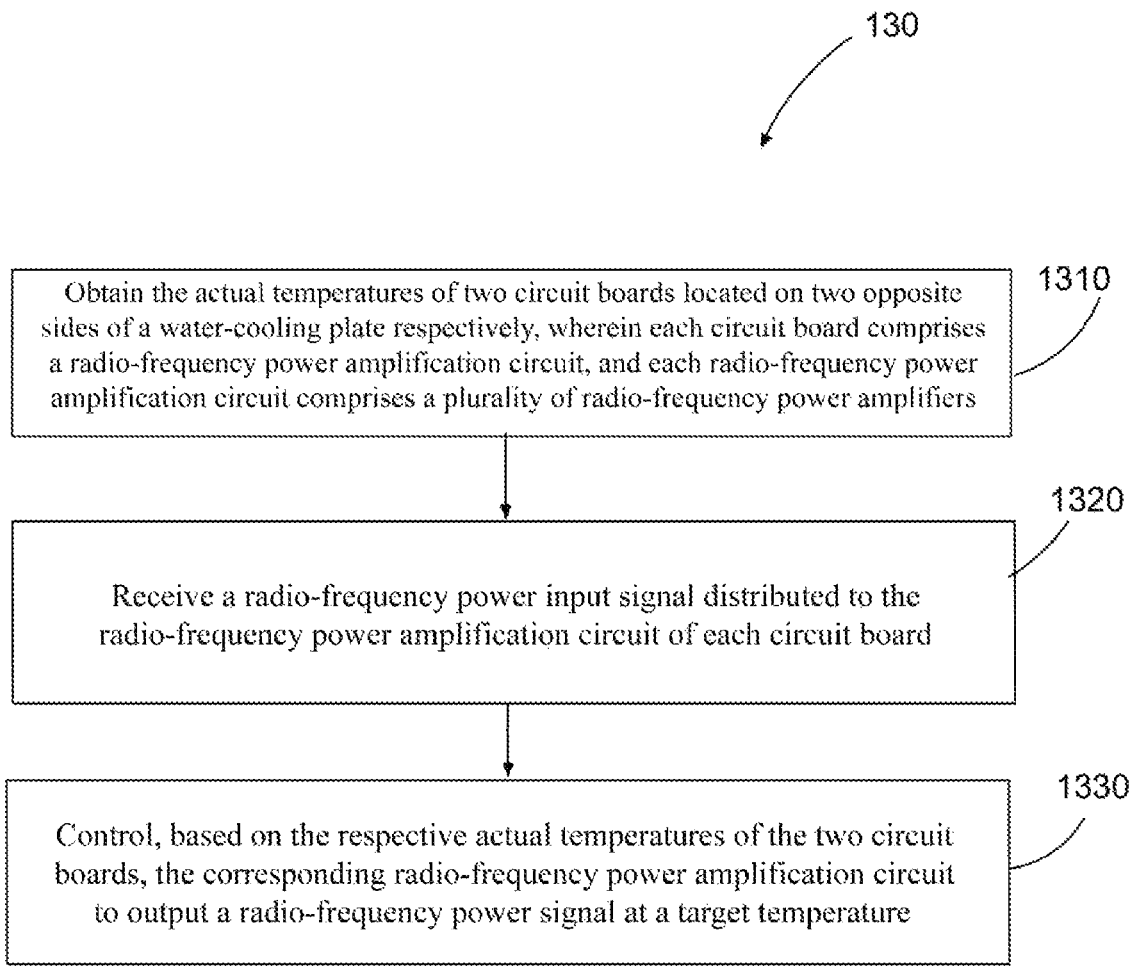
FIG. 13 illustrates a flowchart of a radio-frequency power output method 130 according to some embodiments of the present invention.

Referring to FIG. 13, a flowchart of a radio-frequency signal power output method 130 for a magnetic resonance system is shown according to some embodiments of the present invention. The method can be implemented by a radio-frequency power output device according to any of the above embodiments.

In step 1310, the actual temperatures of two circuit boards located on two opposite sides of a water-cooling plate 62 or 122 respectively are obtained, wherein each circuit board includes a radio-frequency power amplification circuit, and each radio-frequency power amplification circuit includes a plurality of radio-frequency power amplifiers. In this step, the sensed temperatures at symmetrical locations on the two circuit boards are obtained respectively. Obtaining the temperatures of the two circuit boards may include: obtaining an average value of a plurality of sensed temperatures at a plurality of locations on each circuit board.

In step 1320, the radio-frequency power input signal distributed to the radio-frequency power amplification circuit for each circuit board is received.

In step 1330, the corresponding radio-frequency power amplification circuit is controlled, based on the respective actual temperatures of the two circuit boards, to output a radio-frequency power signal at the target temperature. The step can specifically include: adjusting signal characteristics of each radio-frequency power input signal based on pre-acquired temperature characteristics of the radio-frequency power amplifiers respectively, and amplifying the adjusted radio-frequency power input signal by means of the corresponding radio-frequency power amplification circuit, wherein the temperature characteristics of the radio-frequency power amplifiers include the gains or output radio-frequency power signals of the radio-frequency power amplifiers at the actual temperature and target temperature respectively.

Based on the above description, one aspect of the present invention can provide a radio-frequency power output device for a magnetic resonance system. The radio-frequency power output device for a magnetic resonance system includes a cooling plate, a temperature detection module, and a control module. The cooling plate is provided with a first circuit board and a second circuit board on two opposite sides thereof respectively, and the first circuit board and the second circuit board are respectively provided with a first radio-frequency power amplification circuit and a second radio-frequency power amplification circuit. The temperature detection module is used to obtain the temperature of the first circuit board and the temperature of the second circuit board. The control module controls, based on the temperature of the first circuit board, the first radio-frequency power amplification circuit to output a radio-frequency power signal at a target temperature, and controls, based on the temperature of the second circuit board, the second radio-frequency power amplification circuit to output a radio-frequency power signal at the target temperature.

Each of the radio-frequency power amplification circuits includes a plurality of radio-frequency power amplifiers. The control module is used to control the phase and amplitude of the first radio-frequency power input signal input into the first radio-frequency power amplification circuit based on the temperature of the first circuit board and pre-stored temperature characteristics of the radio-frequency power amplifiers. The control module is further used to control the phase and amplitude of the second radio-frequency power input signal input into the second radio-frequency power amplification circuit based on the temperature of the second circuit board and the pre-stored temperature characteristics of the radio-frequency power amplifiers.

The control module includes a first control circuit and a second control circuit, and each of the first control circuit and the second control circuit includes a phase adjuster and an amplitude adjuster. The phase adjuster includes an input terminal, a control terminal and an output terminal. The input terminal of the phase adjuster is used to receive a first radio-frequency power input signal or second radio-frequency power input signal to be adjusted, the control terminal of the phase adjuster is used to receive a corresponding phase adjustment signal, and the phase adjuster is used to adjust the phase of to adjust the phase of the received first radio-frequency power input signal or second radio-frequency power input signal based on the received phase adjustment signal, and to then output the same through the output terminal thereof. The amplitude adjuster includes an input terminal, a control terminal and an output terminal. The input terminal of the amplitude adjuster is used to receive the corresponding phase-adjusted first radio-frequency power input signal or the second radio-frequency power input signal, the control terminal of the amplitude adjuster is used to receive a corresponding amplitude adjustment signal, and the amplitude adjuster is used to adjust the amplitude of the received first radio-frequency power input signal or second radio-frequency power input signal based on the received amplitude adjustment signal, and to then transmit the same to the corresponding first radio-frequency power amplification circuit or second radio-frequency power amplification circuit through the output terminal thereof.

The control module further includes a signal adjustment processing unit which is used to generate the phase adjustment signal and amplitude adjustment signal for the first control circuit based on the temperature of the first circuit board and the temperature characteristics of the radio-frequency power amplifier. The signal adjustment processing unit is further used to generate the phase adjustment signal and amplitude adjustment signal for the second control circuit based on the temperature of the second circuit board and the temperature characteristics of the radio-frequency power amplifier.

The temperature detection module includes a first temperature detector and a second temperature detector. The first temperature detector performs temperature detection on the first circuit board to output a first temperature, the temperature of the first circuit board being generated based on the first temperature. The second temperature detector performs temperature detection on the second circuit board to output a second temperature, the temperature of the second circuit board being generated based on the second temperature.

The first temperature detector and the second temperature detector are symmetrically disposed with respect to the cooling plate.

The first temperature detector and the second temperature detector are embedded in or contact with the cooling plate. The first temperature detector is embedded in or passes through the first circuit board, and the second temperature detector is embedded in or passes through the second circuit board.

The temperature detection module includes a plurality of first temperature detectors and a plurality of second temperature detectors, and the device further includes a temperature processing unit which is used to obtain an average value of a plurality of first temperatures output by a plurality of first temperature detectors as the temperature of the first circuit board, and to obtain an average value of a plurality of second temperatures output by a plurality of second temperature detectors as the temperature of the second circuit board.

The cooling plate includes a body plate and a cooling channel provided in the body plate, the first temperature detector and the second temperature detector being provided along the cooling channel.

The cooling channel includes a cooling medium inlet and a cooling medium outlet, wherein the first temperature detector and the second temperature detector are provided at at least one of the cooling medium inlet and cooling medium outlet.

The cooling channel includes a recess in connection with one of the two opposite sides of the cooling plate and a cooling tube provided in the recess.

The cooling channel passes through the body plate, the cooling plate further including a first spacer provided between the body plate and the first circuit board and a second spacer provided between the body plate and the second circuit board.

One aspect of the present invention may further provide a radio-frequency power output device for a magnetic resonance system, the device including a cooling plate, two radio-frequency power amplification circuits symmetrically disposed on a first side and a second side of the body plate respectively, a first temperature detector, a second temperature detector, a first control circuit and a second control circuit. The cooling plate includes a body plate having opposite first and second sides and a cooling recess provided in the body plate. The cooling recess includes an opening provided on the first side of the body plate and a bottom portion disposed opposite to the opening and located between the first and second sides. The first temperature detector is used to obtain the temperature of the first side of the body plate, and the second temperature detector is used to obtain the temperature of the second side of the body plate. The first control circuit and the second control circuit are respectively connected to the two radio-frequency power amplification circuits and are respectively used to control the corresponding radio-frequency power amplification circuits to output a radio-frequency power signal at the target temperature in response to the received signal characteristic adjustment signal. The signal characteristic adjustment signal received by the first control circuit is generated based on the temperature of the first side of the cooling plate, and the signal characteristic adjustment signal received by the second control circuit is generated based on the temperature of the second side of the cooling plate.

The signal characteristic adjustment signal received by the first control circuit is obtained based on the temperature of a first side of the body plate and the pre-stored temperature characteristics of the radio-frequency power amplifier, and the signal characteristic adjustment signal received by the second control circuit is obtained based on the temperature of a second side of the body plate and the temperature characteristics of the radio-frequency power amplifier.

The signal characteristic adjustment signal includes an amplitude adjustment signal and a phase adjustment signal. Each of the first control circuit and the second control circuit includes a phase adjuster and an amplitude adjuster. The phase adjuster is used to receive the corresponding phase adjustment signal and to adjust, based on the received phase adjustment signal, the phase of a radio-frequency power input signal input into the corresponding radio-frequency power amplification circuit. The amplitude adjuster is used to receive the corresponding amplitude adjustment signal and to adjust, based on the received amplitude adjustment signal, the amplitude of a radio-frequency power input signal input into the corresponding.

The device further includes a first carrier and a second carrier for carrying the two radio-frequency power amplifier circuits, which are respectively attached to the first and second sides of the body plate, the first temperature detector being provided on the first carrier or at least partially provided between the body plate and the first carrier, and the second temperature detector being provided on the second carrier or at least partially provided between the body plate and the second carrier.

A cooling tube is accommodated in the cooling recess, and the cooling tube includes a cooling medium inlet and a cooling medium outlet, wherein the first temperature detector and the second temperature detector are provided at at least one of the cooling medium inlet and cooling medium outlet.

The device includes a plurality of first temperature detectors and a plurality of second temperature detectors, the temperature of the first side of the cooling plate being an average value of a plurality of first temperatures obtained by the plurality of first temperature detectors based on temperature sensing, and the temperature of the second side of the cooling plate being an average value of a plurality of second temperatures obtained by the plurality of second temperature detectors based on temperature sensing.

One aspect of the present invention further provides a radio-frequency power output method for a magnetic resonance system, the method including: obtaining the actual temperatures of two circuit boards located on two opposite sides of a water-cooling plate respectively, wherein each circuit board includes a radio-frequency power amplification circuit and each radio-frequency power amplification circuit includes a plurality of radio-frequency power amplifiers. The method also includes receiving a radio-frequency power input signal distributed to the radio-frequency power amplification circuit of each circuit board and controlling, based on the respective actual temperatures of the two circuit boards, the corresponding radio-frequency power amplification circuit to output a radio-frequency power signal at a target temperature.

The step of "controlling, based on the respective actual temperatures of the two circuit boards, the corresponding radio-frequency power amplification circuit to output a radio-frequency power signal at a target temperature" includes: adjusting signal characteristics of each radio-frequency power input signal based on pre-acquired temperature characteristics of the radio-frequency power amplifiers respectively, and amplifying the adjusted radio-frequency power input signal by means of the corresponding radio-frequency power amplification circuit, wherein the temperature characteristics of the radio-frequency power amplifiers comprise gains or output radio-frequency power signals of the radio-frequency power amplifiers at the actual temperature and at the target temperature respectively.

In addition to any previously indicated modifications, many other variations and replacement arrangements may be devised by those skilled in the art without departing from the substance and scope of the present description, and the appended claims are intended to encompass such modifications and arrangements. Therefore, although the information has been described above in specifics and detailed terms in connection with what is currently considered to be the most practical and preferred aspects, it will be apparent to those of ordinary skill in the art that many modifications can be made, including but not limited to the form, function, mode of operation, and use, without departing from the principles and concepts set forth herein. Likewise, as used herein, in all respects, the examples and embodiments are intended to be illustrative only and should not be construed as limiting in any way.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A radio-frequency power output device for a magnetic resonance system, the device comprising:
a cooling plate, provided with a first circuit board and a second circuit board respectively on two opposite sides thereof, the first circuit board and the second circuit board being provided with a first radio-frequency power amplification circuit and a second radio-frequency power amplification circuit, respectively;
a temperature detection module used to obtain the temperature of the first circuit board and the temperature of the second circuit board; and
a control module used to control, based on the temperature of the first circuit board, the first radio-frequency power amplification circuit to output a radio-frequency power signal at a target temperature, and to control, based on the temperature of the second circuit board, the second radio-frequency power amplification circuit to output a radio-frequency power signal at the target temperature.

2. The device according to claim 1, wherein each of the radio-frequency power amplification circuits comprises a plurality of radio-frequency power amplifiers, and the control module is used to:
control, based on the temperature of the first circuit board and pre-stored temperature characteristics of the radio-frequency power amplifiers, the phase and amplitude of a first radio-frequency power input signal input into the first radio-frequency power amplification circuit; and
control, based on the temperature of the second circuit board and the pre-stored temperature characteristics of the radio-frequency power amplifiers, the phase and amplitude of a second radio-frequency power input signal input into the second radio-frequency power amplification circuit.

3. The device according to claim 2, wherein the control module comprises a first control circuit and a second control circuit, and each of the first control circuit and the second control circuit comprises:
a phase adjuster, comprising an input terminal, a control terminal and an output terminal, the input terminal of the phase adjuster being used to receive a first radio-frequency power input signal or second radio-frequency power input signal to be adjusted, the control terminal of the phase adjuster being used to receive a corresponding phase adjustment signal, and the phase adjuster being used to adjust the phase of the received first radio-frequency power input signal or second radio-frequency power input signal based on the received phase adjustment signal, and to then output the same through the output terminal thereof; and
an amplitude adjuster, comprising an input terminal, a control terminal and an output terminal, the input terminal of the amplitude adjuster being used to receive a corresponding phase-adjusted first radio-frequency power input signal or second radio-frequency power input signal, the control terminal of the amplitude adjuster being used to receive a corresponding amplitude adjustment signal, and the amplitude adjuster being used to adjust the amplitude of the received first radio-frequency power input signal or second radio-frequency power input signal based on the received amplitude adjustment signal, and to then transmit the same to the corresponding first radio-frequency power amplification circuit or second radio-frequency power amplification circuit through the output terminal thereof.

4. The device according to claim 3, wherein the control module further comprises a signal adjustment processing unit used to:
generate the phase adjustment signal and amplitude adjustment signal for the first control circuit based on the temperature of the first circuit board and the temperature characteristics of the radio-frequency power amplifiers; and generate the phase adjustment signal and amplitude adjustment signal for the second control circuit based on the temperature of the second circuit board and the temperature characteristics of the radio-frequency power amplifiers.

5. The device according to claim 1, wherein the temperature detection module comprises:
a first temperature detector used to perform temperature detection on the first circuit board and output a first temperature, the temperature of the first circuit board being generated based on the first temperature; and
a second temperature detector used to perform temperature detection on the second circuit board and output a second temperature, the temperature of the second circuit board being generated based on the second temperature.

6. The device according to claim 5, wherein the first temperature detector and the second temperature detector are symmetrically disposed with respect to the cooling plate.

7. The device according to claim 5, wherein the first temperature detector and the second temperature detector are embedded in or contact the cooling plate, the first temperature detector being embedded in or passing through the first circuit board, and the second temperature detector being embedded in or passing through the second circuit board.

8. The device according to claim 5, wherein the temperature detection module comprises a plurality of first temperature detectors and a plurality of second temperature detectors, and the device further comprises:
a temperature processing unit used to obtain an average value of the plurality of first temperatures output by the plurality of first temperature detectors as the temperature of the first circuit board, and to obtain an average value of the plurality of second temperatures output by the plurality of second temperature detectors as the temperature of the second circuit board.

9. The device according to claim 1, wherein the cooling plate comprises a body plate and a cooling channel provided in the body plate, the first temperature detector and the second temperature detector being provided along the cooling channel.

10. The device according to claim 9, wherein the cooling channel comprises a cooling medium inlet and a cooling medium outlet, wherein the first temperature detector and the second temperature detector are provided at least one of the cooling medium inlet and cooling medium outlet.

11. The device according to claim 9, wherein the cooling channel comprises a recess in connection with one of the two opposite sides of the cooling plate and a cooling tube provided in the recess.

12. The device according to claim 9, wherein the cooling channel passes through the body plate, and the cooling plate further comprises a first spacer provided between the body plate and the first circuit board and a second spacer provided between the body plate and the second circuit board.

13. A radio-frequency power output device for a magnetic resonance system, the device comprising:
a cooling plate, comprising a body plate having opposite first and second sides and a cooling recess provided in the body plate, the cooling recess comprising an opening provided on the first side of the body plate and a bottom portion disposed opposite to the opening and located between the first and second sides;
two radio-frequency power amplification circuits symmetrically disposed on the first side and the second side of the body plate, respectively;
a first temperature detector used to obtain the temperature of the first side of the body plate;
a second temperature detector used to obtain the temperature of the second side of the body plate; and
a first control circuit and a second control circuit respectively connected to the two radio-frequency power amplification circuits, each of the first control circuit and the second control circuit being used to control the corresponding radio-frequency power amplification circuit in response to a received signal characteristic adjustment signal, so as to output a radio-frequency power signal at a target temperature, wherein the signal characteristic adjustment signal received by the first control circuit is generated based on the temperature of a first side of the cooling plate, and the signal characteristic adjustment signal received by the second control circuit is generated based on the temperature of a second side of the cooling plate.

14. The device according to claim 13, wherein the signal characteristic adjustment signal received by the first control circuit is obtained based on the temperature of the first side of the body plate and pre-stored temperature characteristics of radio-frequency power amplifiers, and the signal characteristic adjustment signal received by the second control circuit is obtained based on the temperature of the second side of the body plate and the temperature characteristics of the radio-frequency power amplifiers.

15. The device according to claim 13, wherein the signal characteristic adjustment signal comprises an amplitude adjustment signal and a phase adjustment signal, and each of the first control circuit and the second control circuit comprises:
a phase adjuster, used to receive the corresponding phase adjustment signal and to adjust, based on the received phase adjustment signal, the phase of a radio-frequency power input signal input into the corresponding radio-frequency power amplification circuit; and
an amplitude adjuster, used to receive the corresponding amplitude adjustment signal and to adjust, based on the received amplitude adjustment signal, the amplitude of a radio-frequency power input signal input into the corresponding radio-frequency power amplification circuit.

16. The device according to claim 13, further comprising a first carrier and a second carrier, respectively used to carry the two radio-frequency power amplification circuits and attached to the first side and the second side of the body plate, the first temperature detector being provided on the first carrier or at least partially provided between the body plate and the first carrier, and the second temperature detector being provided on the second carrier or at least partially provided between the body plate and the second carrier.

17. The device according to claim 13, wherein a cooling tube is accommodated in the cooling recess, and comprises a cooling medium inlet and a cooling medium outlet, wherein the first temperature detector and the second temperature detector are provided at least one of the cooling medium inlet and cooling medium outlet.

18. The device according to claim 13, wherein the device comprises a plurality of first temperature detectors and a plurality of second temperature detectors, the temperature of the first side of the cooling plate is an average value of a plurality of first temperatures obtained by the plurality of first temperature detectors based on temperature sensing, and the temperature of the second side of the cooling plate is an average value of a plurality of second temperatures obtained by the plurality of second temperature detectors based on temperature sensing.

19. A radio-frequency power output method for a magnetic resonance system, the method comprising:
- obtaining the actual temperatures of two circuit boards located on two opposite sides of a water-cooling plate respectively, wherein each circuit board comprises a radio-frequency power amplification circuit, and each radio-frequency power amplification circuit comprises a plurality of radio-frequency power amplifiers;
- receiving a radio-frequency power input signal distributed to the radio-frequency power amplification circuit of each circuit board; and
- controlling, based on the respective actual temperatures of the two circuit boards, the corresponding radio-frequency power amplification circuit to output a radio-frequency power signal at a target temperature.

20. The method according to claim 19, wherein the step of controlling, based on the respective actual temperatures of the two circuit boards, the corresponding radio-frequency power amplification circuit to output a radio-frequency power signal at a target temperature comprises:
- adjusting signal characteristics of each radio-frequency power input signal based on pre-acquired temperature characteristics of the radio-frequency power amplifiers respectively, and amplifying the adjusted radio-frequency power input signal by means of the corresponding radio-frequency power amplification circuit, wherein the temperature characteristics of the radio-frequency power amplifiers comprise gains or output radio-frequency power signals of the radio-frequency power amplifiers at the actual temperature and at the target temperature respectively.

* * * * *